(12) United States Patent
Park et al.

(10) Patent No.: US 12,166,097 B2
(45) Date of Patent: Dec. 10, 2024

(54) SEMICONDUCTOR DEVICES WITH STACKED TRANSISTOR STRUCTURES

(71) Applicant: Samsung Electronics Co., Ltd., Suwon-si (KR)

(72) Inventors: Sungil Park, Suwon-si (KR); Jae Hyun Park, Hwaseong-si (KR); Kyungho Kim, Suwon-si (KR); Cheoljin Yun, Yongin-si (KR); Daewon Ha, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 18/390,246

(22) Filed: Dec. 20, 2023

(65) Prior Publication Data

US 2024/0120401 A1 Apr. 11, 2024

Related U.S. Application Data

(63) Continuation of application No. 17/583,314, filed on Jan. 25, 2022, now Pat. No. 11,888,044.

(30) Foreign Application Priority Data

Jun. 28, 2021 (KR) .................. 10-2021-0083780

(51) Int. Cl.
*H01L 29/78* (2006.01)
*H01L 29/423* (2006.01)
*H01L 29/786* (2006.01)

(52) U.S. Cl.
CPC .. *H01L 29/42392* (2013.01); *H01L 29/78618* (2013.01); *H01L 29/78696* (2013.01)

(58) Field of Classification Search
CPC ......... H01L 29/42392; H01L 29/78618; H01L 29/78696; H01L 29/6653; H01L 29/6656; H01L 29/66545; H01L 29/7848
USPC .......................................... 257/288; 438/197
See application file for complete search history.

(56) References Cited

U.S. PATENT DOCUMENTS

| | | | |
|---|---|---|---|
| 10,256,158 B1 | 4/2019 | Frougier et al. | |
| 10,381,438 B2 | 8/2019 | Zhang et al. | |
| 10,510,622 B1 | 12/2019 | Frougier et al. | |
| 10,748,994 B2 | 8/2020 | Reznicek et al. | |
| 10,818,674 B2 | 10/2020 | Mann et al. | |
| 10,840,146 B1 | 11/2020 | Paul et al. | |
| 10,879,308 B1* | 12/2020 | Ando | H10B 63/845 |
| 2019/0131394 A1* | 5/2019 | Reznicek | H01L 21/30604 |

(Continued)

*Primary Examiner* — Didarul A Mazumder
(74) *Attorney, Agent, or Firm* — Harness, Dickey & Pierce, P.L.C.

(57) ABSTRACT

A semiconductor device includes a lower channel pattern and an upper channel pattern stacked on a substrate in a first direction perpendicular to a top surface of the substrate, lower source/drain patterns on the substrate and at a first side and a second side of the lower channel pattern, upper source/drain patterns stacked on the lower source/drain patterns and at a third side and a fourth side of the upper channel pattern, a first barrier pattern between the lower source/drain patterns and the upper source/drain patterns, and a second barrier pattern between the first barrier pattern and the upper source/drain patterns. The first barrier pattern includes a first material and the second barrier pattern includes a second material, wherein the first material and the second material are different.

20 Claims, 36 Drawing Sheets

(56) References Cited

U.S. PATENT DOCUMENTS

| | | | |
|---|---|---|---|
| 2019/0131396 A1* | 5/2019 | Zhang | ............... H01L 21/02236 |
| 2020/0006479 A1 | 1/2020 | Reznicek et al. | |
| 2020/0020768 A1* | 1/2020 | Lee | ...................... H01L 27/092 |
| 2020/0294969 A1 | 9/2020 | Rachmady et al. | |
| 2021/0104522 A1 | 4/2021 | Gardner et al. | |
| 2021/0391477 A1* | 12/2021 | Chang | ............... H01L 29/42392 |
| 2022/0384591 A1 | 12/2022 | Lee et al. | |
| 2022/0415906 A1 | 12/2022 | Park et al. | |

* cited by examiner

SEMICONDUCTOR DEVICES WITH STACKED TRANSISTOR STRUCTURES

CROSS-REFERENCE TO RELATED APPLICATIONS

This U.S. non-provisional patent application is a Continuation of U.S. patent application Ser. No. 17/583,314, filed on Jan. 25, 2022, which claims priority under 35 U.S.C. § 119 to Korean Patent Application No. 10-2021-0083780, filed on Jun. 28, 2021, in the Korean Intellectual Property Office, the entire contents of each of which are hereby incorporated by reference.

BACKGROUND OF THE INVENTION

The present disclosure relates to semiconductor devices and methods of fabricating the same, and in particular, to semiconductor devices including field effect transistors and/or methods of fabricating the same.

A semiconductor device may include an integrated circuit consisting of metal-oxide-semiconductor field-effect transistors (MOS-FETs). To meet an increasing demand for the semiconductor device with a small pattern size and a reduced design rule, the MOS-FETs are being scaled down. The scale-down of the MOS-FETs may lead to deterioration in operation characteristics of the semiconductor device. Accordingly, a variety of studies are being conducted to overcome technical limitations associated with the scale-down of the semiconductor device and to provide high performance semiconductor devices.

SUMMARY

An embodiment of the inventive concepts provides a semiconductor device including stacked transistors with improved performance and a method of fabricating the same.

An embodiment of the inventive concepts provides a method of easily forming stacked transistors with improved performance during fabricating a semiconductor device and a semiconductor device fabricated thereby.

According to an embodiment of the inventive concepts, a semiconductor device may include a lower channel pattern and an upper channel pattern stacked on a substrate in a first direction perpendicular to a top surface of the substrate, the lower channel pattern having a first side and a second side opposite the first side, the upper channel pattern having a third side and a fourth side opposite the third side, lower source/drain patterns on the substrate and at the first side and the second side of the lower channel pattern, upper source/drain patterns stacked on the lower source/drain patterns and at the third side and the fourth side of the upper channel pattern, a first barrier pattern between the lower source/drain patterns and the upper source/drain patterns, and a second barrier pattern between the first barrier pattern and the upper source/drain patterns. The first barrier pattern includes a first material and the second barrier pattern includes a second material, wherein the first material and the second material are different.

According to an embodiment of the inventive concepts, a semiconductor device may include a lower channel pattern and an upper channel pattern stacked on a substrate in a first direction perpendicular to a top surface of the substrate, a gate electrode on the upper channel pattern to cover the upper channel pattern and the lower channel pattern, a lower source/drain pattern at a first side of the gate electrode and connected to the lower channel pattern, an upper source/drain pattern at the first side of the gate electrode and connected to the upper channel pattern, a first barrier pattern between the lower source/drain pattern and the upper source/drain pattern, and a second barrier pattern between the first barrier pattern and the upper source/drain pattern. The first barrier pattern includes a first material and the second barrier pattern includes a second material, wherein the first material and the second material are different.

DETAILED DESCRIPTION

Example embodiments of the inventive concepts will now be described more fully with reference to the accompanying drawings, in which example embodiments are shown.

Figure 1:
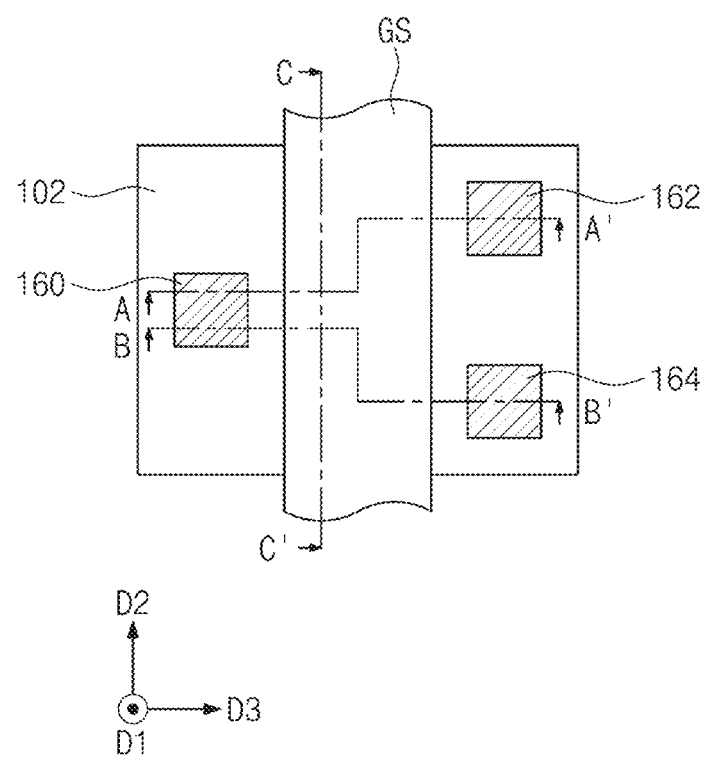
FIG. 1 is a plan view illustrating a semiconductor device according to an embodiment of the inventive concepts.

FIG. 1 is a plan view illustrating a semiconductor device according to an embodiment of the inventive concepts. FIG.

Figure 3:
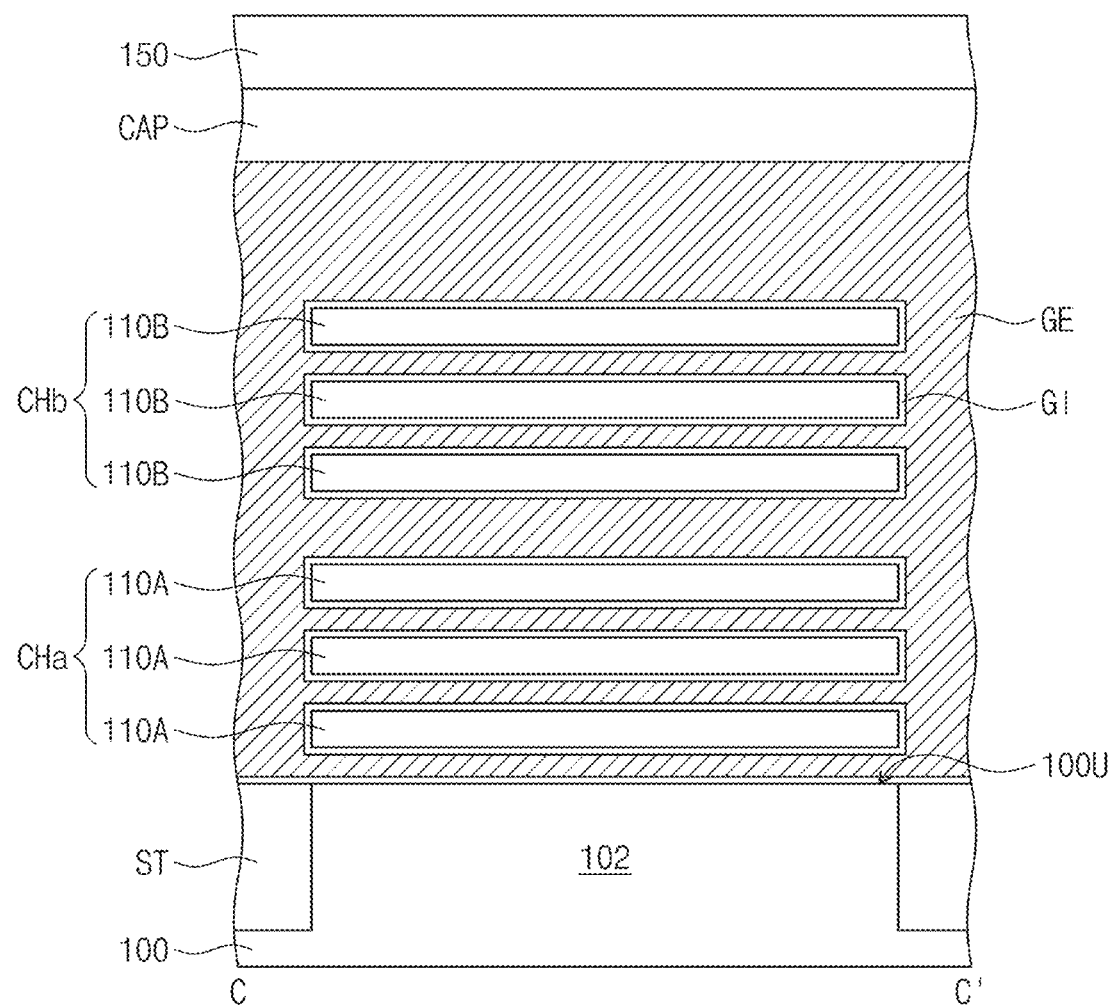
FIG. 3 is a sectional view taken along a line C-C' of FIG. 1.
Figure 4:
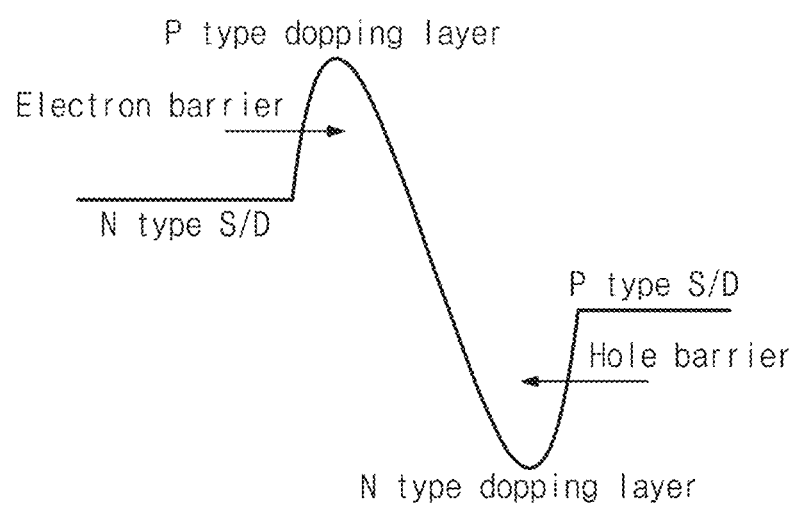
FIG. 4 is a conceptual diagram illustrating a potential barrier between a first barrier pattern and a second barrier pattern according to an embodiment of the inventive concepts.

2 is a sectional view taken along lines A-A' and B-B' of FIG. 1, and FIG. 3 is a sectional view taken along a line C-C' of FIG. 1. FIG. 4 is a conceptual diagram illustrating a potential barrier between a first barrier pattern and a second barrier pattern according to an embodiment of the inventive concepts.

Figure 2:
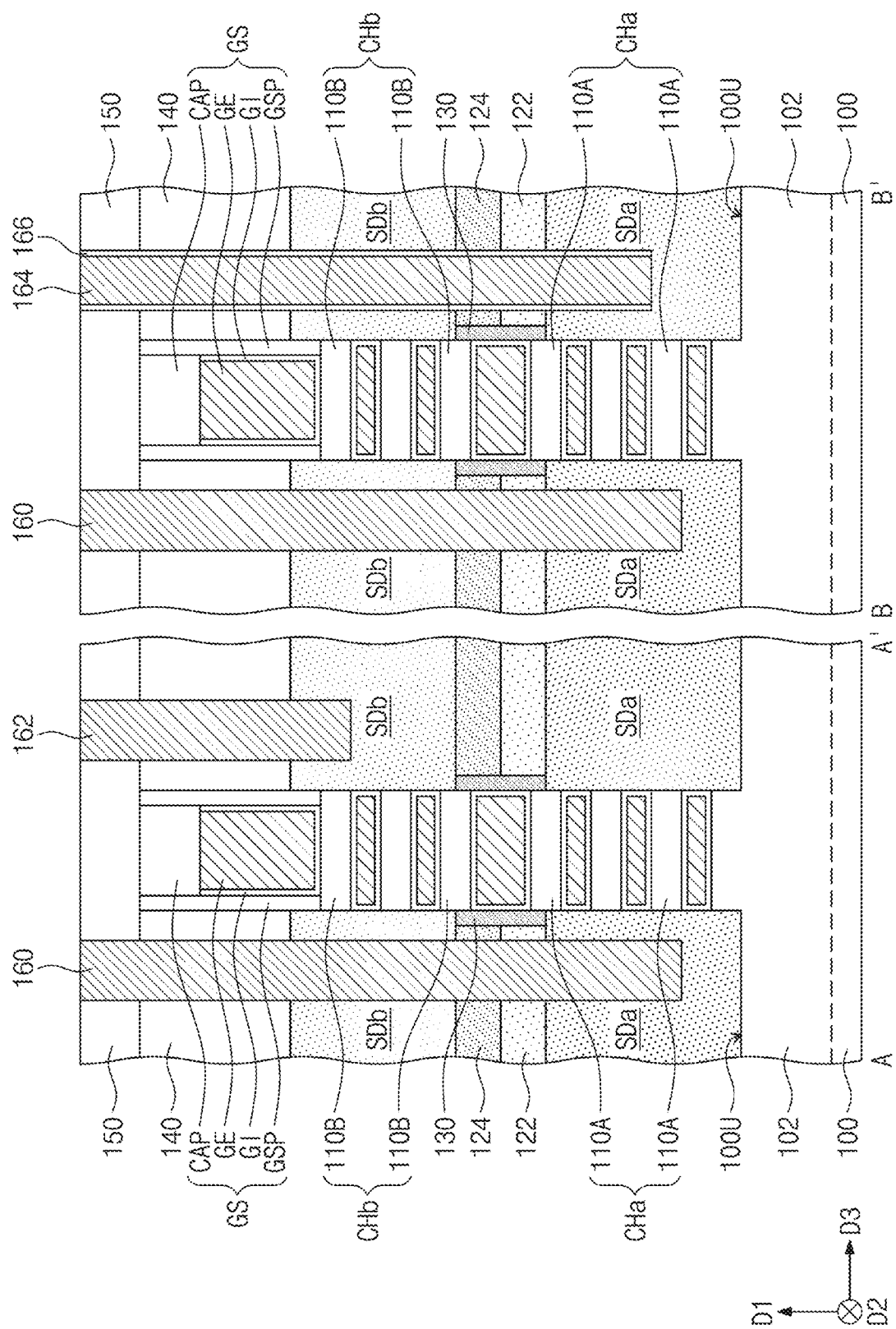
FIG. 2 is a sectional view taken along lines A-A' and B-B' of FIG. 1.

Referring to FIGS. 1 to 3, a substrate 100 including an active region 102 may be provided. The substrate 100 may be a semiconductor substrate. As an example, the substrate 100 may be a silicon substrate, a germanium substrate, a silicon-germanium substrate, or a silicon-on-insulator (SOI) substrate. A device isolation layer ST may be provided on the substrate 100 to define the active region 102. The device isolation layer ST may be provided to cover a side surface of the active region 102 and to expose a top surface of the active region 102. The device isolation layer ST may be formed of or include at least one of silicon oxide, silicon nitride, and/or silicon oxynitride.

A lower channel pattern CHa and an upper channel pattern CHb may be stacked on the active region 102 of the substrate 100. The lower and upper channel patterns CHa and CHb may be sequentially stacked in a first direction D1 that is perpendicular to a top surface 100U of the substrate 100. The top surface 100U of the substrate 100 may correspond to a top surface of the active region 102.

In an embodiment, the lower channel pattern CHa may include a plurality of lower semiconductor patterns 110A stacked in the first direction D1. The lower semiconductor patterns 110A may be spaced apart from each other in the first direction D1. The lowermost one of the lower semiconductor patterns 110A may be an upper portion of the active region 102. The lower semiconductor patterns 110A may be formed of or include at least one of silicon (Si), silicon germanium (SiGe), or germanium (Ge). The upper channel pattern CHb may include a plurality of upper semiconductor patterns 110B stacked in the first direction D1. The upper semiconductor patterns 110B may be spaced apart from each other in the first direction D1. The lowermost one of the upper semiconductor patterns 110B may be spaced apart from the uppermost one of the lower semiconductor patterns 110A in the first direction D1. The upper semiconductor patterns 110B may be formed of or include at least one of silicon (Si), silicon germanium (SiGe), or germanium (Ge).

The lower and upper semiconductor patterns 110A and 110B may be stacked on the active region 102 to be spaced apart from each other in the first direction D1. In an embodiment, each of the lower and upper semiconductor patterns 110A and 110B may be provided on the active region 102 and may be elongated in a second direction D2 that is parallel to the top surface 100U of the substrate 100.

Lower source/drain patterns SDa may be disposed on the active region 102 of the substrate 100. The lower source/drain patterns SDa may be disposed at both sides (i.e., two opposite sides) of the lower channel pattern CHa and may be connected to the lower channel pattern CHa. The lower source/drain patterns SDa may be spaced apart from each other in a third direction D3, which is parallel to the top surface 100U of the substrate 100 and cross to the second direction D2. The lower source/drain patterns SDa may be spaced apart from each other in the third direction D3, with the lower channel pattern CHa interposed therebetween. In an embodiment, the lower semiconductor patterns 110A of the lower channel pattern CHa may be interposed between the lower source/drain patterns SDa. Each of the lower semiconductor patterns 110A may be connected to the lower source/drain patterns SDa and may be in direct contact with the lower source/drain patterns SDa. Each of the lower source/drain patterns SDa may be in contact with side surfaces of the lower semiconductor patterns 110A.

The lower source/drain patterns SDa may be epitaxial patterns, which are formed using the substrate 100 and the lower semiconductor patterns 110A as a seed layer. The lower source/drain patterns SDa may be formed of or include at least one of silicon germanium (SiGe), silicon (Si), or silicon carbide (SiC). The lower source/drain patterns SDa may be configured to exert a tensile strain or a compressive strain on the lower channel pattern CHa.

Upper source/drain patterns SDb may be disposed on the active region 102 of the substrate 100 and may be stacked on the lower source/drain patterns SDa. The upper source/drain patterns SDb may be stacked on the lower source/drain patterns SDa in the first direction D1 and may be spaced apart from the lower source/drain patterns SDa in the first direction D1. The upper source/drain patterns SDb may be disposed at both sides of the upper channel pattern CHb and may be connected to the upper channel pattern CHb. The upper source/drain patterns SDb may be spaced apart from each other in the third direction D3, with the upper channel pattern CHb interposed therebetween. In an embodiment, the upper semiconductor patterns 110B of the upper channel pattern CHb may be interposed between the upper source/drain patterns SDb. Each of the upper semiconductor patterns 110B may be connected to the upper source/drain patterns SDb and may be in direct contact with the upper source/drain patterns SDb. Each of the upper source/drain patterns SDb may be in contact with side surfaces of the upper semiconductor patterns 110B.

The upper source/drain patterns SDb may be epitaxial patterns which are formed using a second barrier pattern, which will be described below, and the upper semiconductor patterns 110B as a seed layer. The upper source/drain patterns SDb may be formed of or include at least one of silicon germanium (SiGe), silicon (Si), or silicon carbide (SiC). The upper source/drain patterns SDb may be configured to exert a tensile strain or a compressive strain on the upper channel pattern CHb.

A first barrier pattern 122 may be disposed between the lower and upper source/drain patterns SDa and SDb. The first barrier pattern 122 may include a pair of first barrier patterns 122, which are spaced apart from each other in the third direction D3. One of the pair of first barrier patterns 122 may be disposed between one of the lower source/drain patterns SDa and one of the upper source/drain patterns SDb, and the other of the pair of first barrier patterns 122 may be disposed between the other of the lower source/drain patterns SDa and the other of the upper source/drain patterns SDb.

A second barrier pattern 124 may be disposed between the first barrier pattern 122 and the upper source/drain patterns SDb. The second barrier pattern 124 may include a pair of second barrier patterns 124 that are spaced apart from each other in the third direction D3. One of the pair of second barrier patterns 124 may be disposed between one of the pair of first barrier patterns 122 and one of the upper source/drain patterns SDb, and the other of the pair of second barrier patterns 124 may be disposed between the other of the pair of first barrier patterns 122 and the other of the upper source/drain patterns SDb.

An insulating spacer 130 may be disposed between the lower source/drain patterns SDa and the upper source/drain patterns SDb. The insulating spacer 130 may include a pair of insulating spacers 130 which are spaced apart from each other in the third direction D3. One of the pair of insulating spacers 130 may be disposed between one of the lower source/drain patterns SDa and one of the upper source/drain patterns SDb, and the other of the pair of insulating spacers 130 may be disposed between the other of the lower source/drain patterns SDa and the other of the upper source/drain patterns SDb. The pair of insulating spacers 130 may be disposed between the pair of first barrier patterns 122 and may be extended into a region between the pair of second barrier patterns 124. The pair of insulating spacers 130 may be extended in the first direction D1, between the lower source/drain patterns SDa and the upper source/drain patterns SDb. The insulating spacer 130 may be formed of or include an insulating material (e.g., silicon nitride).

The first and second barrier patterns 122 and 124 may be formed of or include different materials from each other. In an embodiment, the first and second barrier patterns 122 and 124 may be formed of or include semiconductor materials that have different conductivity types from each other. As an example, the first barrier pattern 122 may have a first conductivity type, and the second barrier pattern 124 may have a second conductivity type different from the first conductivity type. The lower source/drain patterns SDa may have a conductivity type that is different from the upper source/drain patterns SDb. The lower source/drain patterns SDa may have a conductivity type different from the first barrier pattern 122 (e.g., the second conductivity type). The upper source/drain patterns SDb may have a different conductivity type from the second barrier pattern 124 (e.g., the first conductivity type).

The first barrier pattern 122 and the upper source/drain patterns SDb may have the first conductivity type and may contain a first impurity. In the case where the first conductivity type is an n-type, the first impurity may be arsenic (As) or phosphorus (P), and in the case where the first conductivity type is a p-type, the first impurity may be boron (B). A concentration of the first impurity in the upper source/drain patterns SDb may be higher than a concentration of the first impurity in the first barrier pattern 122. The second barrier pattern 124 and the lower source/drain patterns SDa may have the second conductivity type and may have a second impurity. In the case where the second conductivity type is an n-type, the second impurity may be arsenic (As) or phosphorus (P), and in the case where the second conductivity type is a p-type, the second impurity may be boron (B). A concentration of the second impurity in the lower source/drain patterns SDa may be higher than a concentration of the second impurity in the second barrier pattern 124.

Referring to FIG. 4, in an embodiment, the first and second barrier patterns 122 and 124 may serve as a potential barrier between the lower and upper source/drain patterns SDa and SDb. The description that follows will refer to an example in which the first conductivity type is the p-type and the second conductivity type is the n-type. In the case where the lower source/drain patterns SDa are of the n-type and the first barrier pattern 122 is of the p-type, the first barrier pattern 122 may serve as an energy barrier preventing diffusion of electrons in the lower source/drain patterns SDa. Furthermore, in the case where the upper source/drain patterns SDb are of the p-type and the second barrier pattern 124 is of the n-type, the second barrier pattern 124 may serve as an energy barrier preventing diffusion of holes in the upper source/drain patterns SDb. The description that follows will refer to an example in which the first conductivity type is the n-type and the second conductivity type is the p-type. In the case where the lower source/drain patterns SDa are of a p-type and the first barrier pattern 122 is of an n-type, the first barrier pattern 122 may serve as an energy barrier preventing diffusion of holes in the lower source/drain patterns SDa. Furthermore, in the case where the upper source/drain patterns SDb are of an n-type and the second barrier pattern 124 is of a p-type, the second barrier pattern 124 may serve as an energy barrier preventing diffusion of electrons in the upper source/drain patterns SDb.

Referring back to FIGS. 1 to 3, a gate structure GS may be disposed on the upper channel pattern CHb to cover the upper and lower channel patterns CHb and CHa. The gate structure GS may be extended in the second direction D2 to cover side surfaces of the upper channel pattern CHb, which are opposite to each other in the second direction D2, and side surfaces of the lower channel pattern CHa, which are opposite to each other in the second direction D2. The upper and lower channel patterns CHb and CHa may be vertically overlapped with the gate structure GS in the first direction D1. The lower source/drain patterns SDa may be disposed at both sides of the gate structure GS and on the substrate 100. The pair of first barrier patterns 122 may be disposed at both sides of the gate structure GS and may be stacked on the lower source/drain patterns SDa. The pair of second barrier patterns 124 may be disposed at both sides of the gate structure GS and may be stacked on the pair of first barrier patterns 122. The upper source/drain patterns SDb may be disposed at both sides of the gate structure GS and may be stacked on the pair of second barrier patterns 124. The pair of insulating spacers 130 may be disposed at both sides of the gate structure GS and may be interposed between the pair of first barrier patterns 122 and the gate structure GS and between the pair of second barrier patterns 124 and the gate structure GS.

One of the lower source/drain patterns SDa, one of the pair of first barrier patterns 122, one of the pair of second barrier patterns 124, and one of the upper source/drain patterns SDb may be sequentially stacked at a side of the gate structure GS and in the first direction D1. One of the pair of insulating spacers 130 may be interposed between the one of the pair of first barrier patterns 122 and the gate structure GS and may be extended into a region between the one of the pair of second barrier patterns 124 and the gate structure GS. The one of the pair of insulating spacers 130 may be extended in the first direction D1, between the one of the lower source/drain patterns SDa and the one of the upper source/drain patterns SDb. The one of the pair of first barrier patterns 122 and the one of the pair of second barrier patterns 124 may be disposed at a side of the one of the pair of insulating spacers 130, and the lower channel pattern CHa, the upper channel pattern CHb, and the gate structure GS may be disposed at an opposite side of the one of the pair of insulating spacers 130.

The gate structure GS may include a gate electrode GE, which is disposed on the upper channel pattern CHb to cover the upper and lower channel patterns CHb and CHa, a gate insulating pattern GI, which is provided between the gate electrode GE and each of the upper and lower channel patterns CHb and CHa, gate spacers GSP, which are provided on side surfaces of the gate electrode GE, and a gate capping pattern CAP, which is provided on a top surface of the gate electrode GE.

The gate electrode GE may be extended in the second direction D2 to cover side surfaces of the upper channel pattern CHb, which are opposite to each other in the second direction D2, and side surfaces of the lower channel pattern CHa, which are opposite to each other in the second direction D2. In an embodiment, the gate electrode GE may be extended into a region between the upper and lower channel patterns CHb and CHa. The insulating spacer 130 may be interposed between a portion of the gate electrode GE, which is located between the upper and lower channel patterns CHb and CHa, and the first barrier pattern 122 and may be extended into a region between the portion of the gate electrode GE and the second barrier pattern 124. The insulating spacer 130 may be interposed between the first barrier pattern 122 and at least one of the lower channel pattern CHa and the gate electrode GE and may be extended into a region between the second barrier pattern 124 and at least one of the upper channel pattern CHb and the gate electrode GE. The gate electrode GE may be extended into regions between the upper semiconductor patterns 110B of the upper channel pattern CHb, between the lower semiconductor patterns 110A of the lower channel pattern CHa, and between the lowermost one of the upper semiconductor patterns 110B and the uppermost one of the lower semiconductor patterns 110A.

The gate spacers GSP may be disposed on the upper channel pattern CHb and may be extended along side surfaces of the gate electrode GE and in the second direction D2. The gate insulating pattern GI may be interposed between the upper channel pattern CHb and the gate electrode GE and may be extended into a region between the gate electrode GE and the gate spacers GSP. The topmost surface of the gate insulating pattern GI may be substantially coplanar with the top surface of the gate electrode GE. In an embodiment, the gate insulating pattern GI may be interposed between each of the upper semiconductor patterns 110B of the upper channel pattern CHb and the gate electrode GE to cover an outer surface of each of the upper semiconductor patterns 110B. Each of the upper semiconductor patterns 110B may be spaced apart from the gate electrode GE with the gate insulating pattern GI interposed therebetween. The gate insulating pattern GI may be extended in a region between each of the upper source/drain patterns SDb and the gate electrode GE. The gate insulating pattern GI may be interposed between each of the lower semiconductor patterns 110A of the lower channel pattern CHa and the gate electrode GE to cover an outer surface of each of the lower semiconductor patterns 110A. Each of the lower semiconductor patterns 110A may be spaced apart from the gate electrode GE with the gate insulating pattern GI interposed therebetween. The gate insulating pattern GI may be extended in a region between each of the lower source/drain patterns SDa and the gate electrode GE. The gate insulating pattern GI may be extended along a bottom surface of the gate electrode GE and may be interposed between the gate electrode GE and the device isolation layer ST. The gate capping pattern CAP may be extended along the top surface of the gate electrode GE and in the second direction D2. The gate spacers GSP may be extended to a region on side surfaces of the gate capping pattern CAP, and the topmost surfaces of the gate spacers GSP may be substantially coplanar with a top surface of the gate capping pattern CAP.

The gate electrode GE may be formed of or include at least one of doped semiconductor materials, conductive metal nitrides, and/or metallic materials. The gate insulating pattern GI may be formed of or include at least one of silicon oxide, silicon nitride, silicon oxynitride, or high-k dielectric materials. The high-k dielectric materials may include materials (e.g., hafnium oxide (HfO), aluminum oxide (AlO), or tantalum oxide (TaO)) having higher dielectric constants than silicon oxide. Each of the gate spacers GSP and the gate capping pattern CAP may be formed of or include at least one of silicon oxide, silicon nitride, or silicon oxynitride.

The gate electrode GE, the lower channel pattern CHa, and the lower source/drain patterns SDa may constitute a lower transistor, and the gate electrode GE, the upper channel pattern CHb, and the upper source/drain patterns SDb may constitute an upper transistor. In an embodiment, each of the lower and upper transistors may be a gate-all-around field effect transistor (GAAFET) or a multi-bridge channel field effect transistor (MBCFET). The lower and upper transistors may be vertically stacked on the substrate 100 and in the first direction D1 and may be called 'stacked transistors'.

A first interlayer insulating layer 140 may be disposed on the substrate 100 to cover the gate structure GS and the upper source/drain patterns SDb. The first interlayer insulating layer 140 may be formed of or include at least one of silicon oxide, silicon nitride, silicon oxynitride, or low-k dielectric materials. The top surface of the gate capping pattern CAP may be substantially coplanar with a top surface of the first interlayer insulating layer 140. A second interlayer insulating layer 150 may be disposed on the first interlayer insulating layer 140 to cover the top surface of the gate capping pattern CAP. The second interlayer insulating layer 150 may be formed of or include at least one of silicon oxide, silicon nitride, silicon oxynitride, or low-k dielectric materials.

A common electrode 160 may be disposed at one side of the gate structure GS. The common electrode 160 may be provided to penetrate the first and second interlayer insulating layers 140 and 150 and may be electrically connected to one of the upper source/drain patterns SDb. The common electrode 160 may be extended to penetrate the first and second barrier patterns 122 and 124 and may be electrically connected to one of the lower source/drain patterns SDa. The common electrode 160 may be electrically connected to the one of the upper source/drain patterns SDb and the one of the lower source/drain patterns SDa. The common electrode 160 may be formed of or include a conductive material.

An upper electrode 162 and a lower electrode 164 may be disposed at an opposite side of the gate structure GS. The upper electrode 162 may be provided to penetrate the first and second interlayer insulating layers 140 and 150 and may be electrically connected to other of the upper source/drain patterns SDb. The lower electrode 164 may be provided to penetrate the first and second interlayer insulating layers 140 and 150, the other of the upper source/drain patterns SDb, and the first and second barrier patterns 122 and 124 and may be electrically connected to other of the lower source/drain patterns SDa. The upper electrode 162 and the lower electrode 164 may be formed of or include a conductive material.

An insulating sidewall pattern 166 may cover a side surface of the lower electrode 164. The insulating sidewall pattern 166 may be interposed between each of the first and second interlayer insulating layers 140 and 150 and the lower electrode 164, between the other of the upper source/drain patterns SDb and the lower electrode 164, and between each of the first and second barrier patterns 122 and 124 and the lower electrode 164. The lower electrode 164 may be electrically disconnected from the first and second interlayer insulating layers 140 and 150, the other of the upper source/drain patterns SDb, and the first and second barrier patterns 122 and 124 by the insulating sidewall pattern 166. The lower electrode 164 may be extended into the other of the lower source/drain patterns SDa. The insulating sidewall pattern 166 may be extended into a region between the other of the lower source/drain patterns SDa and the lower electrode 164 to expose at least portion of the lower electrode 164. The lower electrode 164 may be electrically connected to the other of the lower source/drain patterns SDa through the exposed portion of the lower electrode 164. The insulating sidewall pattern 166 may be formed of or include an insulating material.

According to an embodiment of the inventive concepts, the first and second barrier patterns 122 and 124 may be formed of or include semiconductor materials, which have different conductivity types from each other, and may serve as a potential barrier between the lower and upper source/drain patterns SDa and SDb. Since the second barrier pattern 124 includes the semiconductor material, the second barrier pattern 124 may be used as a seed layer in an epitaxial growth process for forming the upper source/drain patterns SDb. Accordingly, the upper source/drain patterns SDb may be easily grown using the second barrier pattern 124 and the upper semiconductor patterns 110B as a seed layer, and as a result, it may be possible to prevent the upper transistor, which includes the upper source/drain patterns SDb, from being deteriorated. In addition, since the first and second barrier patterns 122 and 124 serve as a potential barrier between the lower and upper source/drain patterns SDa and SDb, the lower transistor including the lower source/drain patterns SDa may be electrically disconnected from the upper transistor including the upper source/drain patterns SDb. Accordingly, it may be possible to easily fabricate the stacked transistors with improved performance.

FIGS. 5, 7, 9, 11, 13, 15, 17, 19, 21, and 23 are sectional views, which illustrate a method of fabricating a semiconductor device according to an embodiment of the inventive concepts and correspond to the lines A-A' and B-B' of FIG. 1. FIGS. 6, 8, 10, 12, 14, 16, 18, 20, 22, and 24 are sectional views, which illustrate a method of fabricating a semiconductor device according to an embodiment of the inventive concepts and correspond to the line C-C' of FIG. 1. For the sake of brevity, an element previously described with reference to FIGS. 1 to 4 may be identified by the same reference number without repeating an overlapping description thereof.

Figure 5:
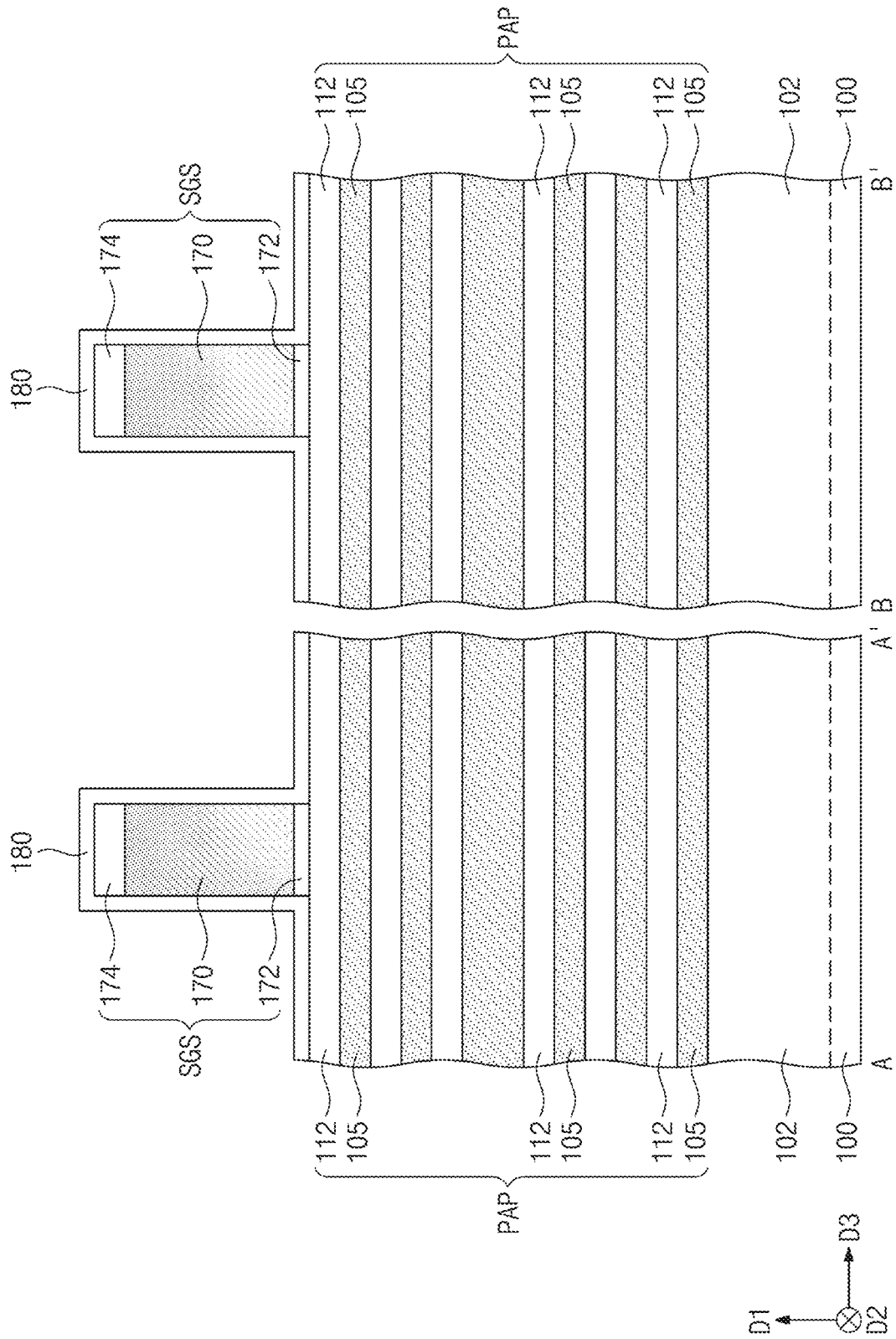
FIGS. 5, 7, 9, 11, 13, 15, 17, 19, 21, and 23 are sectional views, which illustrate a method of fabricating a semiconductor device according to an embodiment of the inventive concepts and correspond to the lines A-A' and B-B' of FIG. 1.
Figure 6:
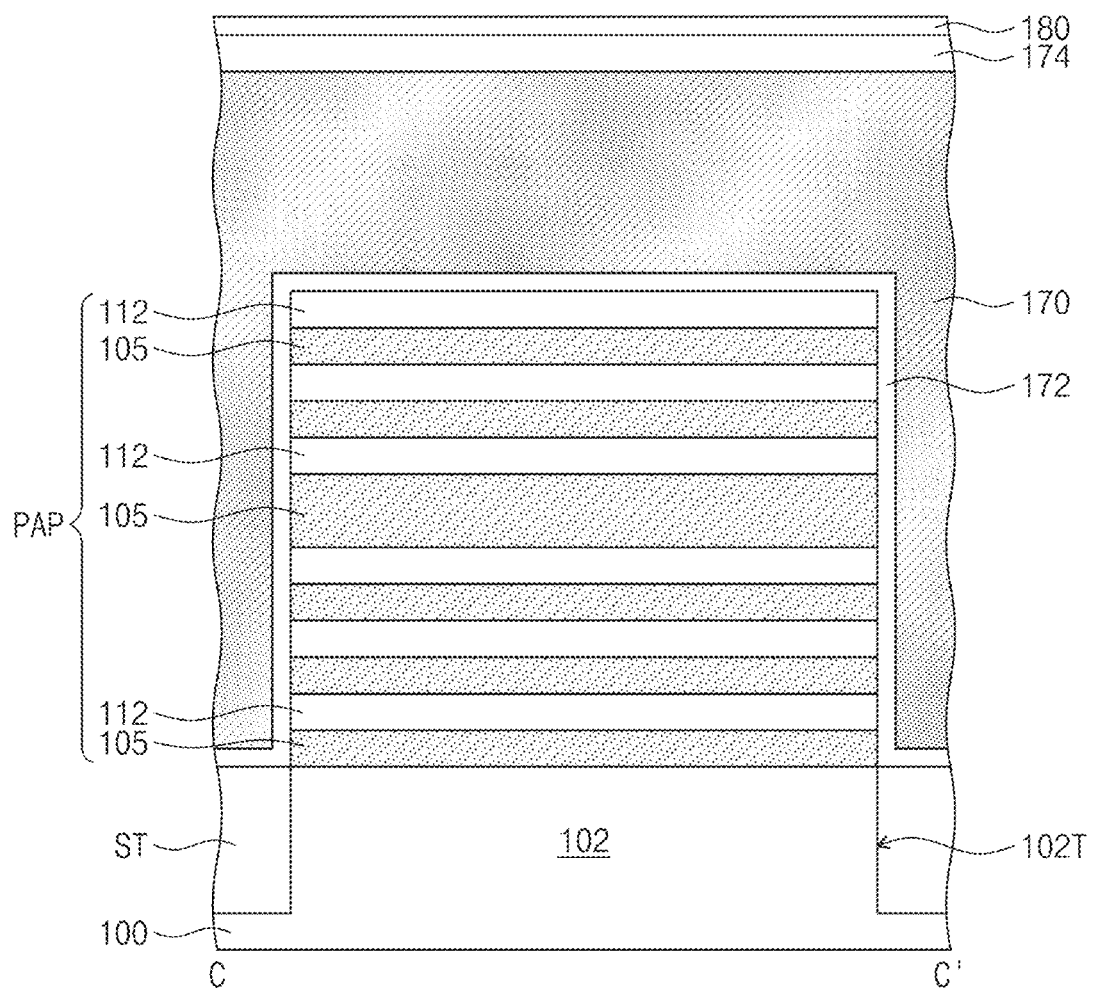
FIGS. 6, 8, 10, 12, 14, 16, 18, 20, 22, and 24 are sectional views, which illustrate a method of fabricating a semiconductor device according to an embodiment of the inventive concepts and correspond to the line C-C' of FIG. 1.

Referring to FIGS. 5 and 6, sacrificial layers 105 and semiconductor layers 112 may be alternately and repeatedly stacked on a substrate 100. The sacrificial layers 105 may be formed of or include a material that has an etch selectivity with respect to the semiconductor layers 112. As an example, the sacrificial layers 105 may be silicon germanium (SiGe) layers, and the semiconductor layers 112 may be silicon (Si) layers. The sacrificial layers 105 and the semiconductor layers 112 may be formed by performing an epitaxial growth process using the substrate 100 as a seed layer. The sacrificial layers 105 and the semiconductor layers 112 may be formed to have the same thickness or different thicknesses from each other.

The sacrificial layers 105, the semiconductor layers 112, and an upper portion of the substrate 100 may be sequentially patterned to form a trench 102T defining an active region 102 in the substrate 100. The patterned sacrificial layers 105 and the patterned semiconductor layers 112 may be disposed on the active region 102 and may be referred to as a preliminary active pattern PAP. A device isolation layer ST may be formed to fill the trench 102T. In an embodiment, the formation of the device isolation layer ST may include forming an insulating layer on the substrate 100 to fill the trench 102T and recessing the insulating layer to expose side surfaces of the preliminary active pattern PAP.

A sacrificial gate structure SGS may be formed on the active region 102 to cross the preliminary active pattern PAP. The sacrificial gate structure SGS may have a line shape extending in the second direction D2 and may cross the active region 102 and the device isolation layer ST. The sacrificial gate structure SGS may include an etch stop pattern 172, a sacrificial gate pattern 170, and a mask pattern 174, which are sequentially stacked on the preliminary active pattern PAP. The sacrificial gate pattern 170 may have a line shape extending in the second direction D2 and may cross the preliminary active pattern PAP. The sacrificial gate pattern 170 may be extended to a region on the device isolation layer ST. The etch stop pattern 172 may be interposed between the preliminary active pattern PAP and the sacrificial gate pattern 170 and may be extended into a region between the device isolation layer ST and the sacrificial gate pattern 170.

The formation of the sacrificial gate pattern 170 and the etch stop pattern 172 may include sequentially forming an etch stop layer (not shown) and a sacrificial gate layer (not shown) on the substrate 100 to cover the preliminary active pattern PAP, forming the mask pattern 174 on the sacrificial gate layer to define a region, on which the sacrificial gate pattern 170 will be formed, and sequentially patterning the sacrificial gate layer and the etch stop layer using the mask pattern 174 as an etch mask. For example, the etch stop layer may include a silicon oxide layer. The sacrificial gate layer may be formed of or include a material that has an etch selectivity with respect to the etch stop layer. For example, the sacrificial gate layer may be formed of or include poly silicon. The sacrificial gate pattern 170 may be formed by patterning the sacrificial gate layer using the mask pattern 174 as an etch mask. The patterning of the sacrificial gate layer may include an etching process, which is performed to have an etch selectivity with respect to the etch stop layer. After the formation of the sacrificial gate pattern 170, the etch stop layer at both sides of the sacrificial gate pattern 170 may be removed, and thus, the etch stop pattern 172 may be locally formed below the sacrificial gate pattern 170.

A gate spacer layer 180 may be formed to cover the sacrificial gate structure SGS. The gate spacer layer 180 may cover top and side surfaces of the sacrificial gate structure SGS and may be extended to a region on a top surface of the preliminary active pattern PAP. In an embodiment, the gate spacer layer 180 may be formed of or include silicon nitride.

Figure 7:
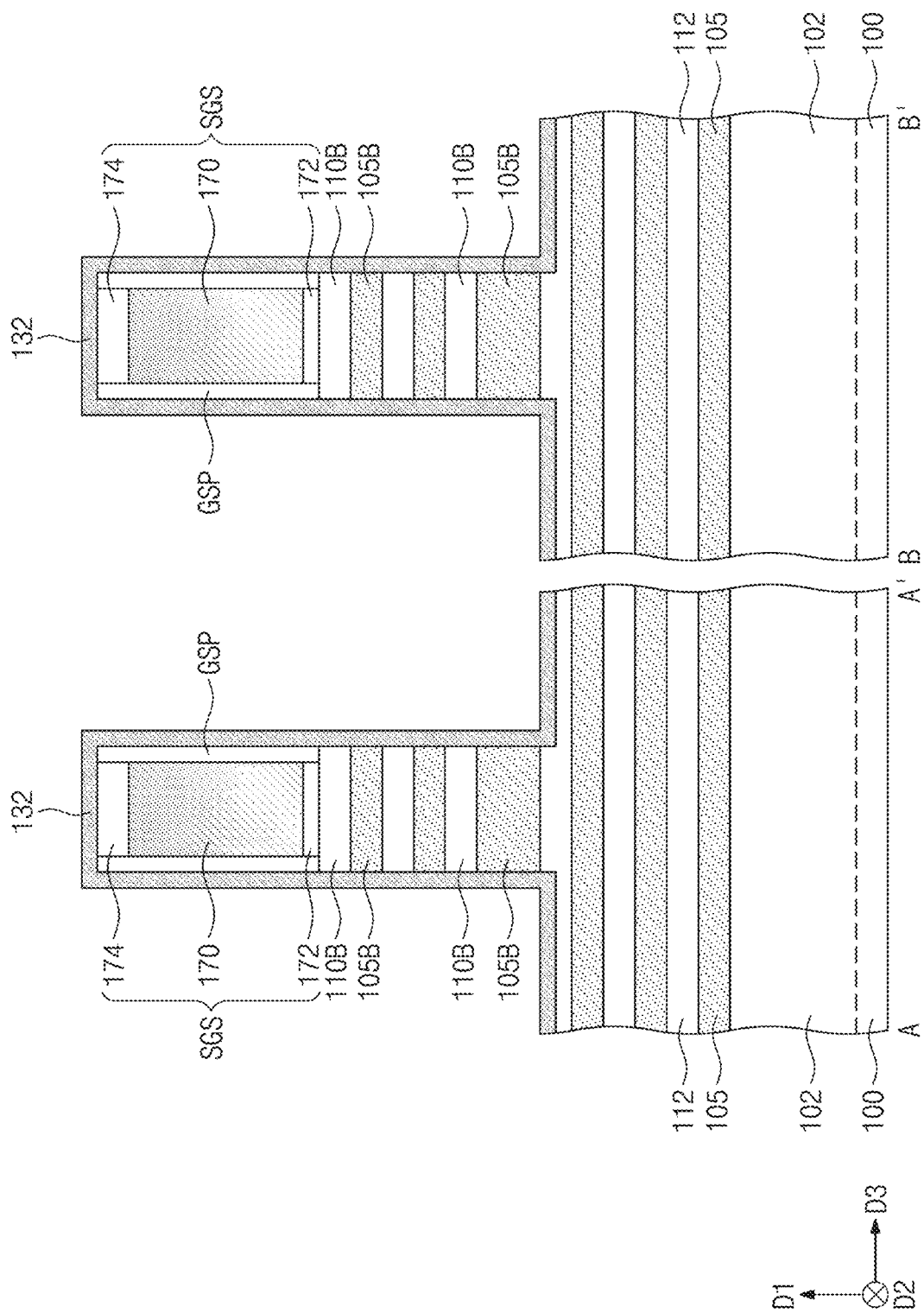
Figure 8:
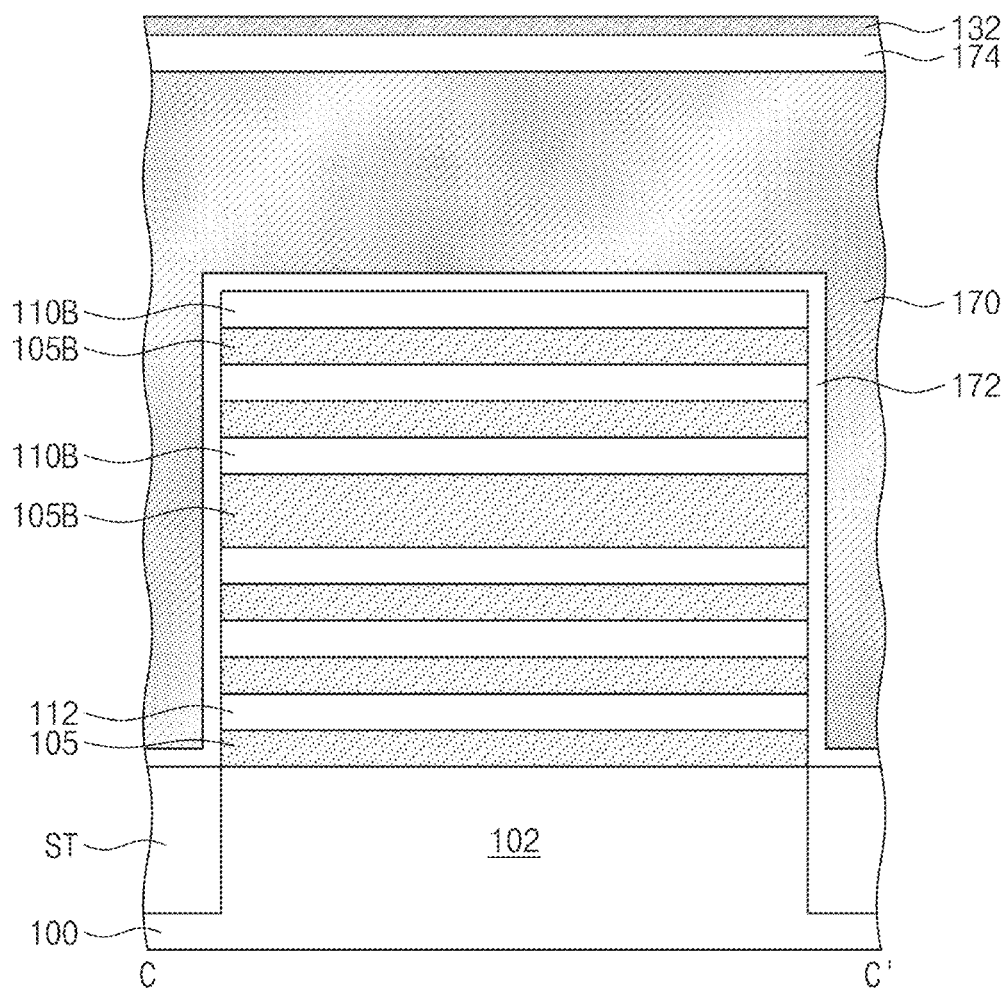
Figure 8:
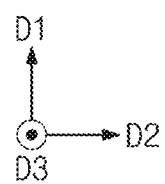

Referring to FIGS. 7 and 8, a first etching process may be performed on the gate spacer layer 180. The gate spacer layer 180 may be anisotropically etched by the first etching process, and thus, gate spacers GSP may be formed on side surfaces of the sacrificial gate structure SGS. An upper portion of the preliminary active pattern PAP may be etched by the first etching process, and thus, upper sacrificial patterns 105B and upper semiconductor patterns 110B may be formed. The upper sacrificial patterns 105B and the upper semiconductor patterns 110B may be formed by etching the upper portion of the preliminary active pattern PAP using the sacrificial gate structure SGS and the gate spacers GSP as an etch mask.

After the formation of the upper sacrificial patterns 105B and the upper semiconductor patterns 110B, an insulating spacer layer 132 may be formed to cover the sacrificial gate structure SGS. The insulating spacer layer 132 may cover top and side surfaces of the sacrificial gate structure SGS, and the gate spacers GSP may be interposed between the side surfaces of the sacrificial gate structure SGS and the insulating spacer layer 132. The insulating spacer layer 132 may conformally cover side surfaces of the upper sacrificial patterns 105B and the upper semiconductor patterns 110B and may be extended to a region on a top surface of a remaining portion of the preliminary active pattern PAP. In an embodiment, the insulating spacer layer 132 may be formed of or include silicon nitride.

Figure 9:
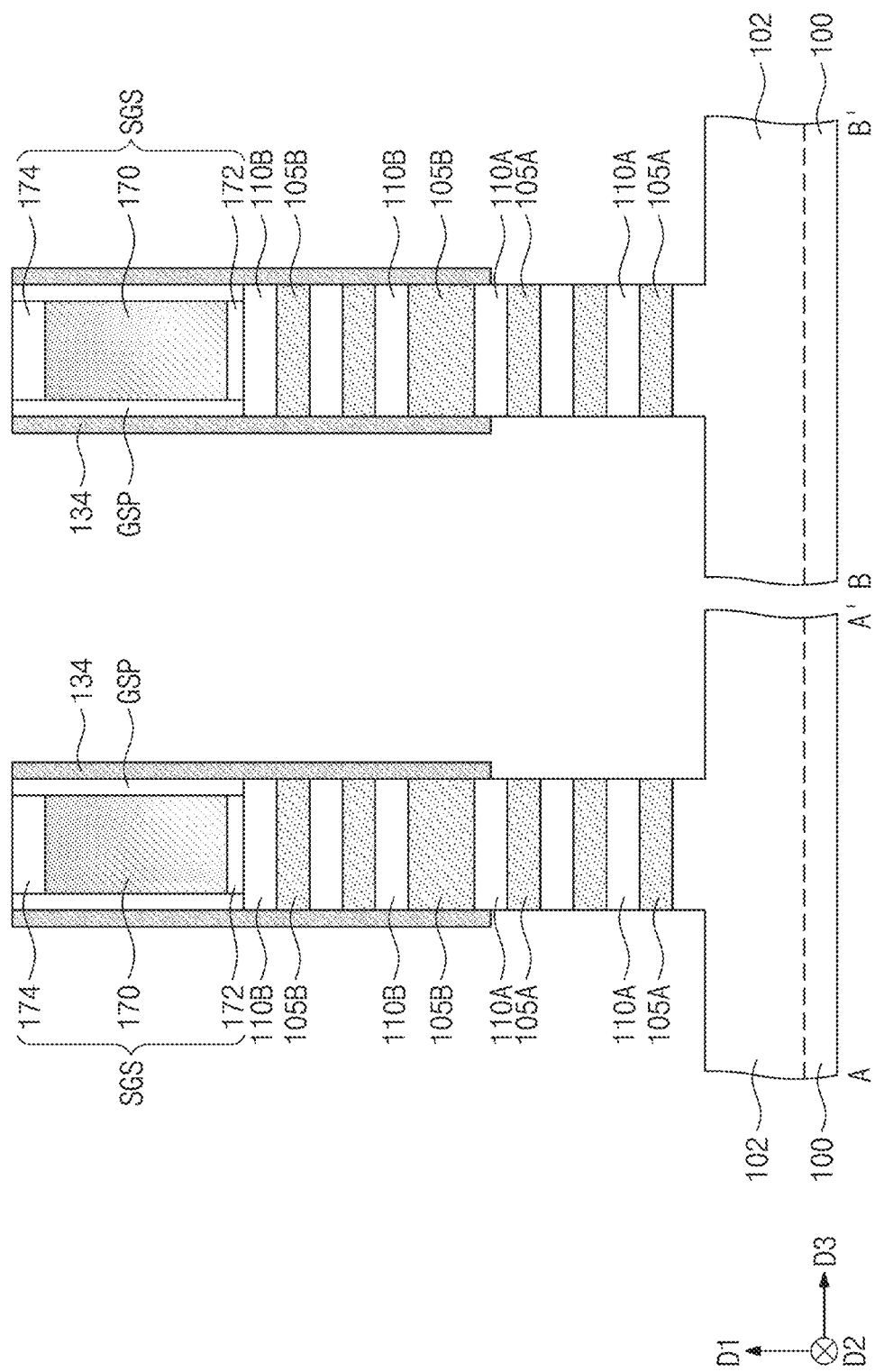
Figure 10:
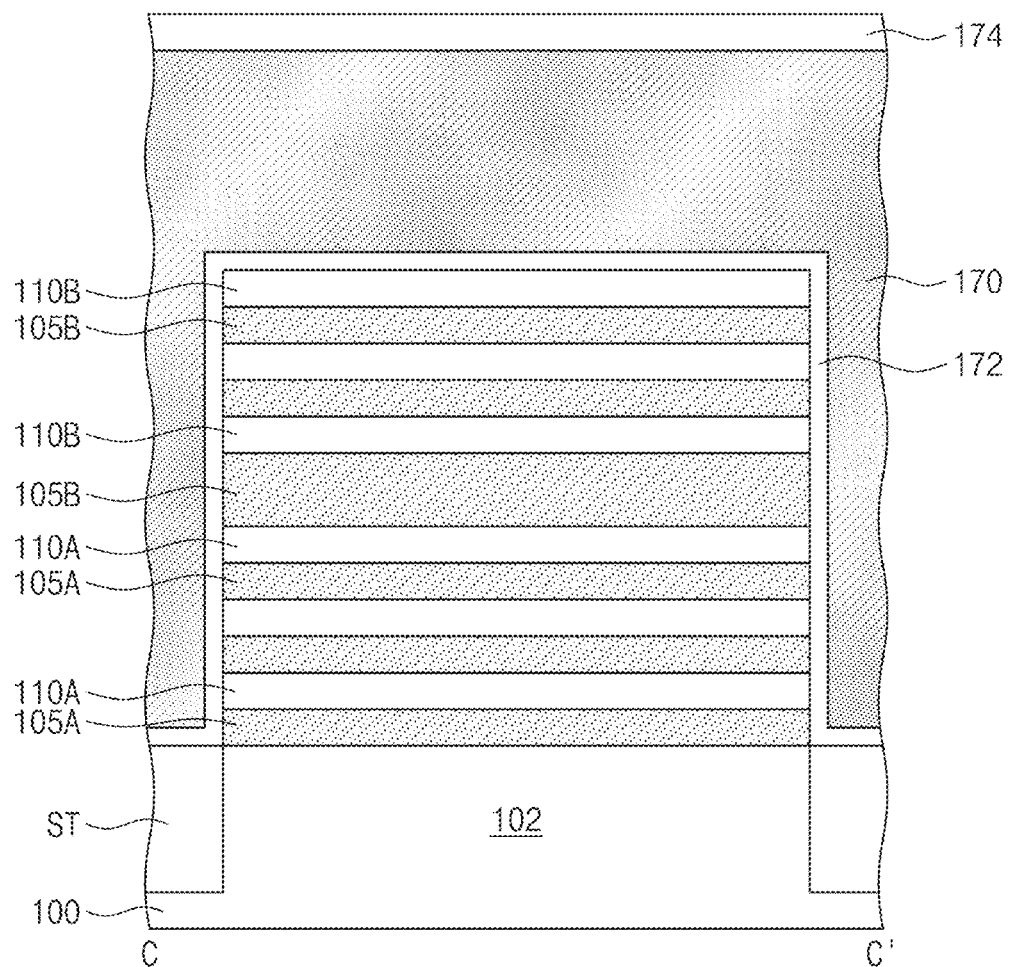

Referring to FIGS. 9 and 10, a second etching process may be performed on the insulating spacer layer 132. The insulating spacer layer 132 may be anisotropically etched by the second etching process, and thus, preliminary insulating spacers 134 may be formed on side surfaces of the sacrificial gate structure SGS, the upper sacrificial patterns 105B, and the upper semiconductor patterns 110B. The gate spacers GSP may be interposed between the side surfaces of the sacrificial gate structure SGS and the preliminary insulating spacers 134. The remaining portion of the preliminary active pattern PAP and an upper portion of the active region 102 may be etched by the second etching process, and thus, lower sacrificial patterns 105A and lower semiconductor patterns 110A may be formed. The lower sacrificial patterns 105A and the lower semiconductor patterns 110A may be formed by etching the remaining portion of the preliminary active pattern PAP and the upper portion of the active region 102 using the sacrificial gate structure SGS and the preliminary insulating spacers 134 as an etch mask. In an embodiment, the second etching process may further include laterally recessing side surfaces of the lower sacrificial patterns 105A and the lower semiconductor patterns 110A.

Figure 11:
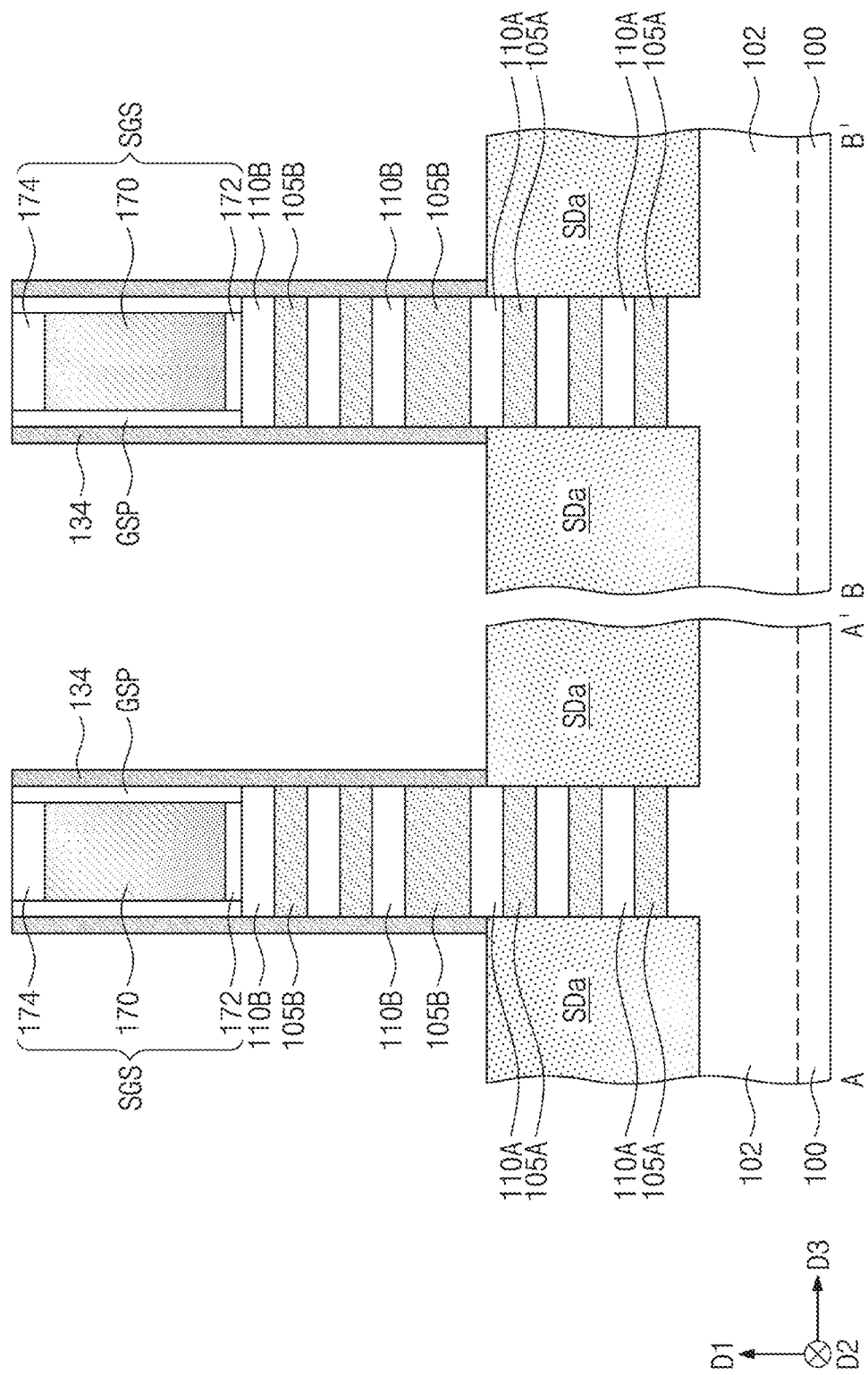
Figure 12:
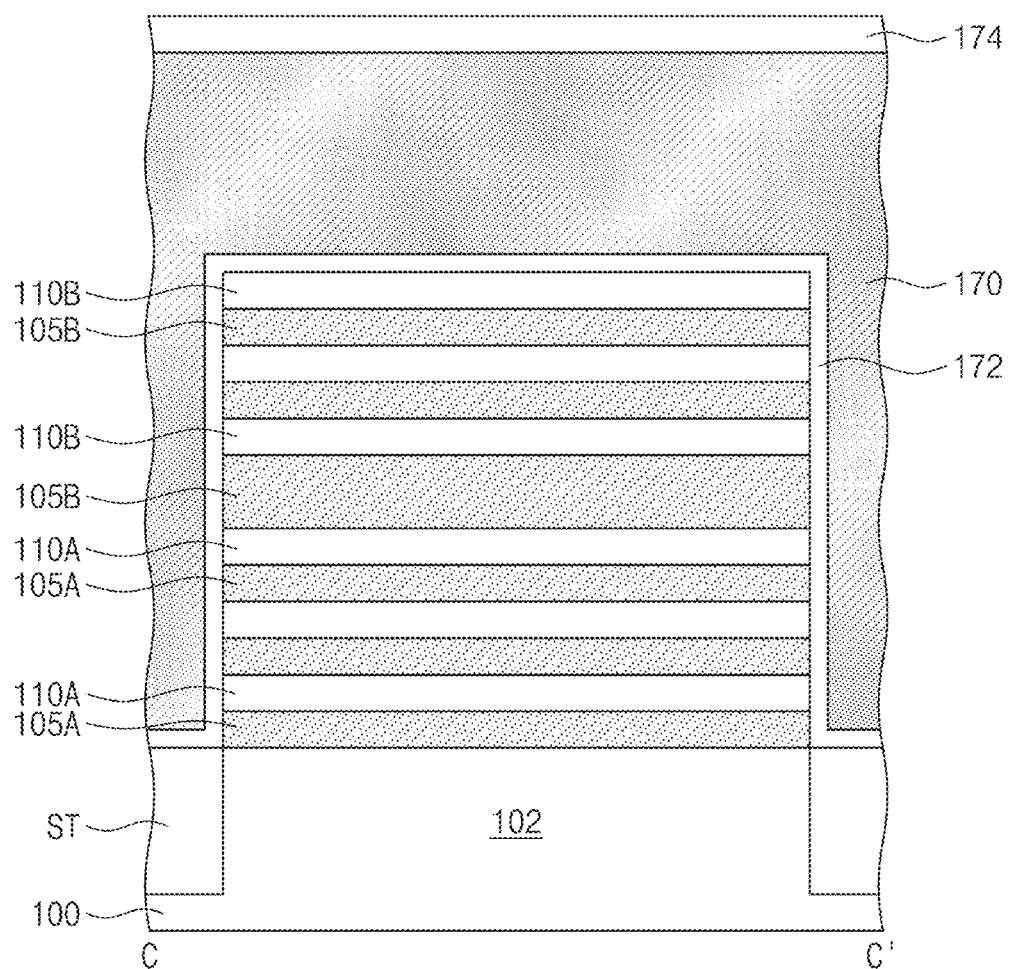
Figure 12:
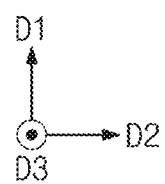

Referring to FIGS. 11 and 12, lower source/drain patterns SDa may be formed on the active region 102 of the substrate 100. The lower source/drain patterns SDa may be formed by a first selective epitaxial growth process using the substrate 100 and the lower semiconductor patterns 110A as a seed layer. The lower source/drain patterns SDa may be doped with impurities, during or after the first selective epitaxial growth process. The impurities may be used to improve electric characteristics of a transistor including the lower source/drain patterns SDa. In the case where the transistor is an NMOSFET, the impurity may be, for example, arsenic (As) or phosphorus (P), and in the case where the transistor is a PMOSFET, the impurity may be, for example, boron (B). The lower sacrificial patterns 105A and the lower semiconductor patterns 110A may be interposed between the lower source/drain patterns SDa.

Figure 13:
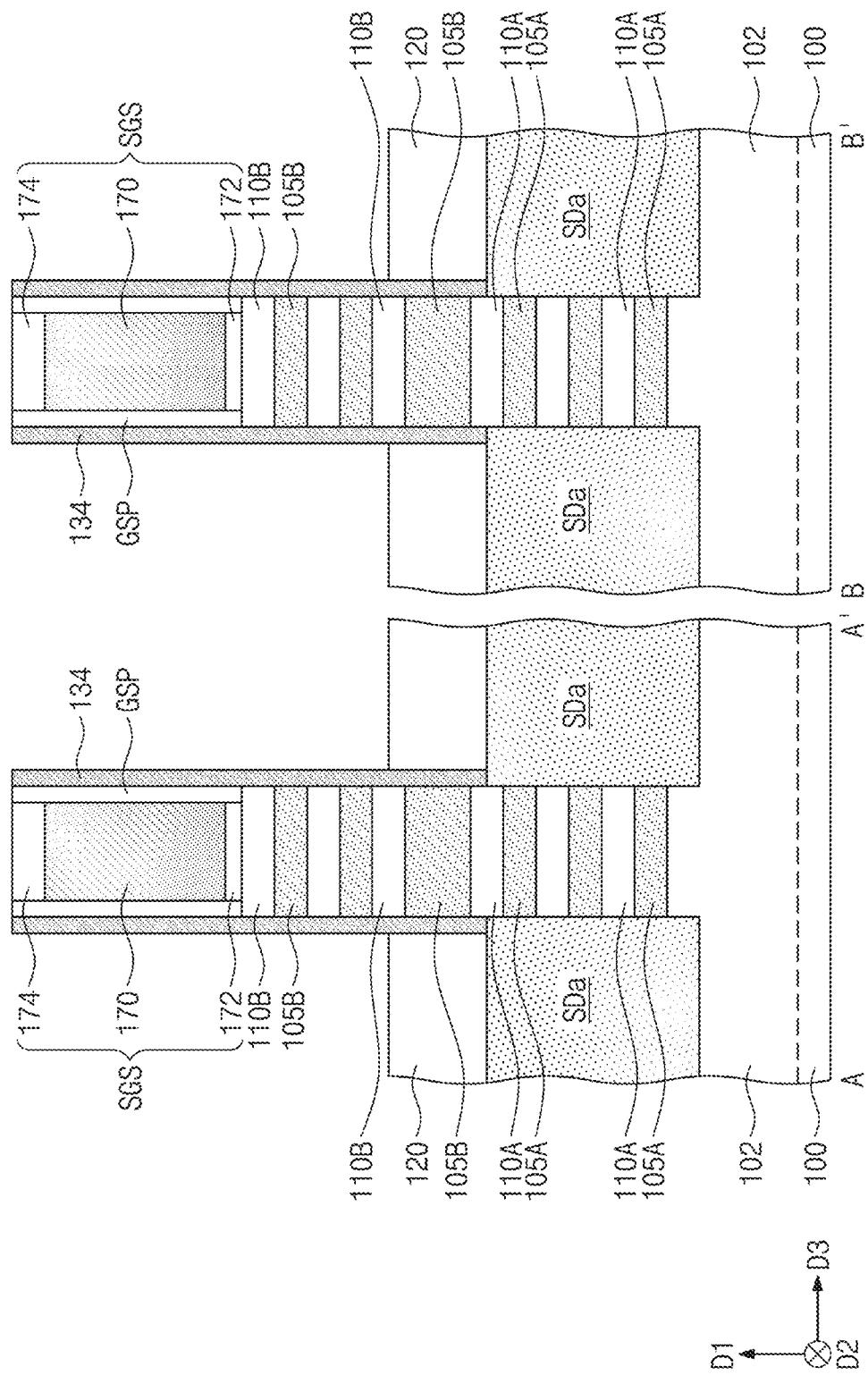
Figure 14:
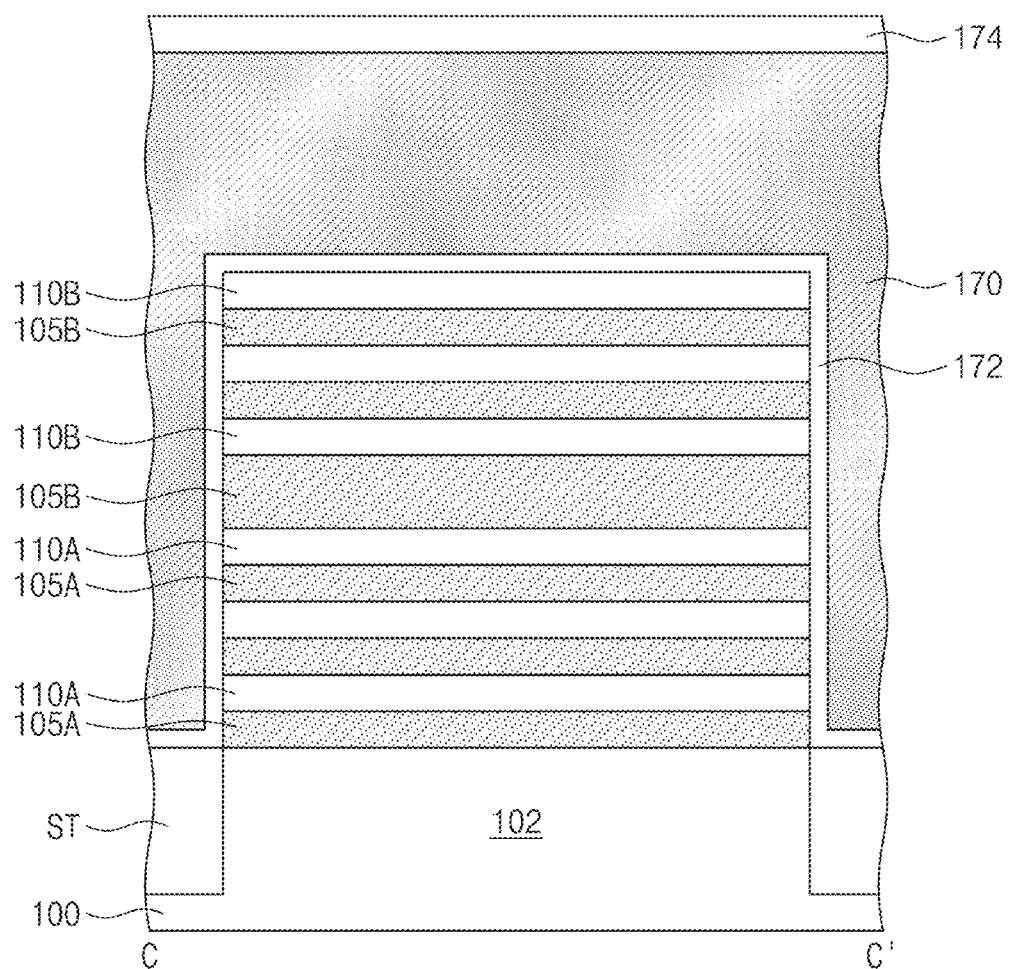
Figure 14:
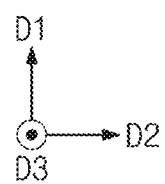

Referring to FIGS. 13 and 14, a semiconductor layer 120 may be formed on the lower source/drain patterns SDa. The semiconductor layer 120 may be formed to cover lower portions of the preliminary insulating spacers 134. The lower portion of each of the preliminary insulating spacers 134 may be interposed between the semiconductor layer 120 and at least one of the upper sacrificial patterns 105B and the upper semiconductor patterns 110B. In an embodiment, the formation of the semiconductor layer 120 may include depositing the semiconductor layer 120 on the substrate 100 provided with the lower source/drain patterns SDa and recessing the semiconductor layer 120 until the semiconductor layer 120 has a specific thickness. In an embodiment, the semiconductor layer 120 may be a silicon layer.

Figure 15:
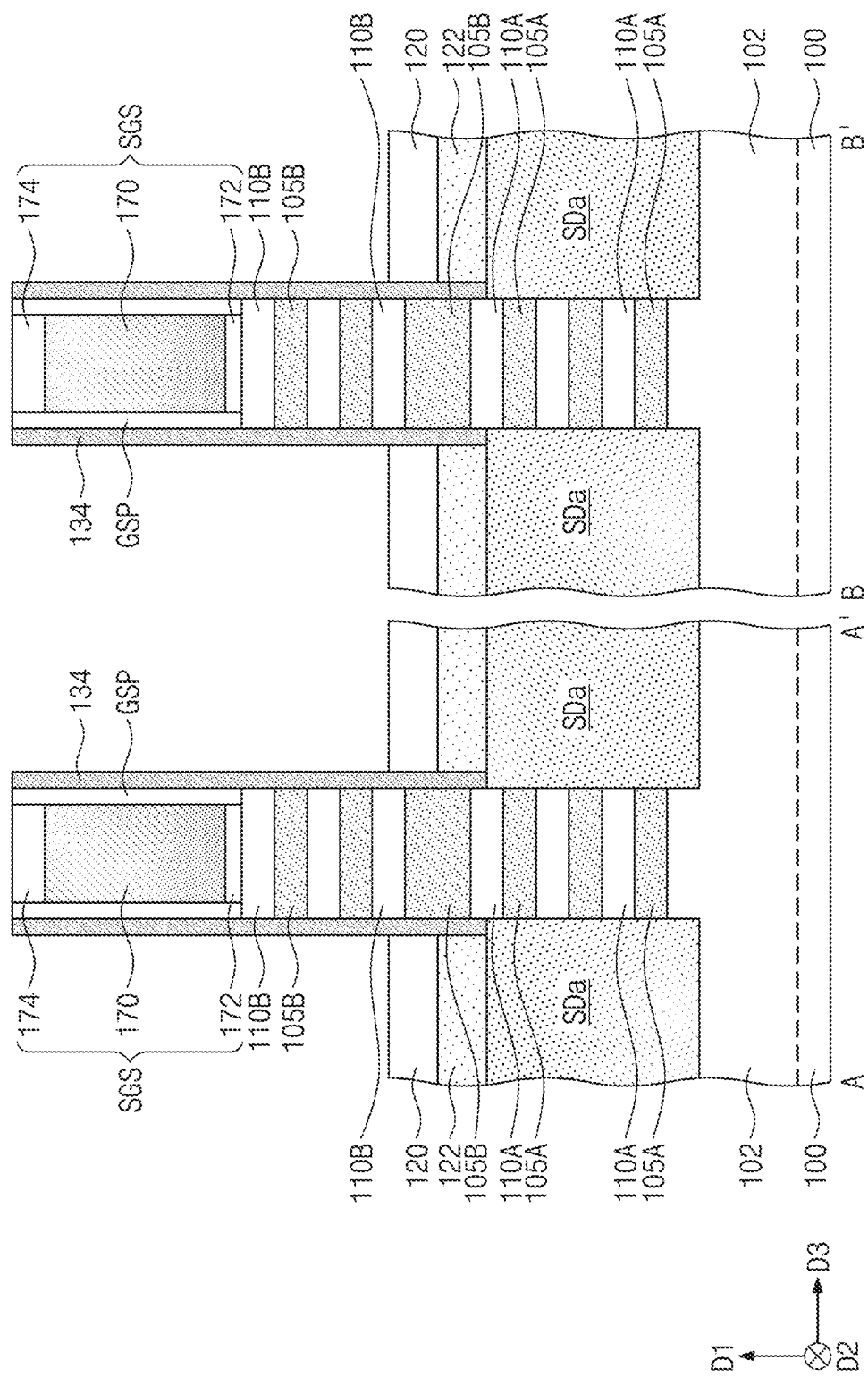
Figure 16:
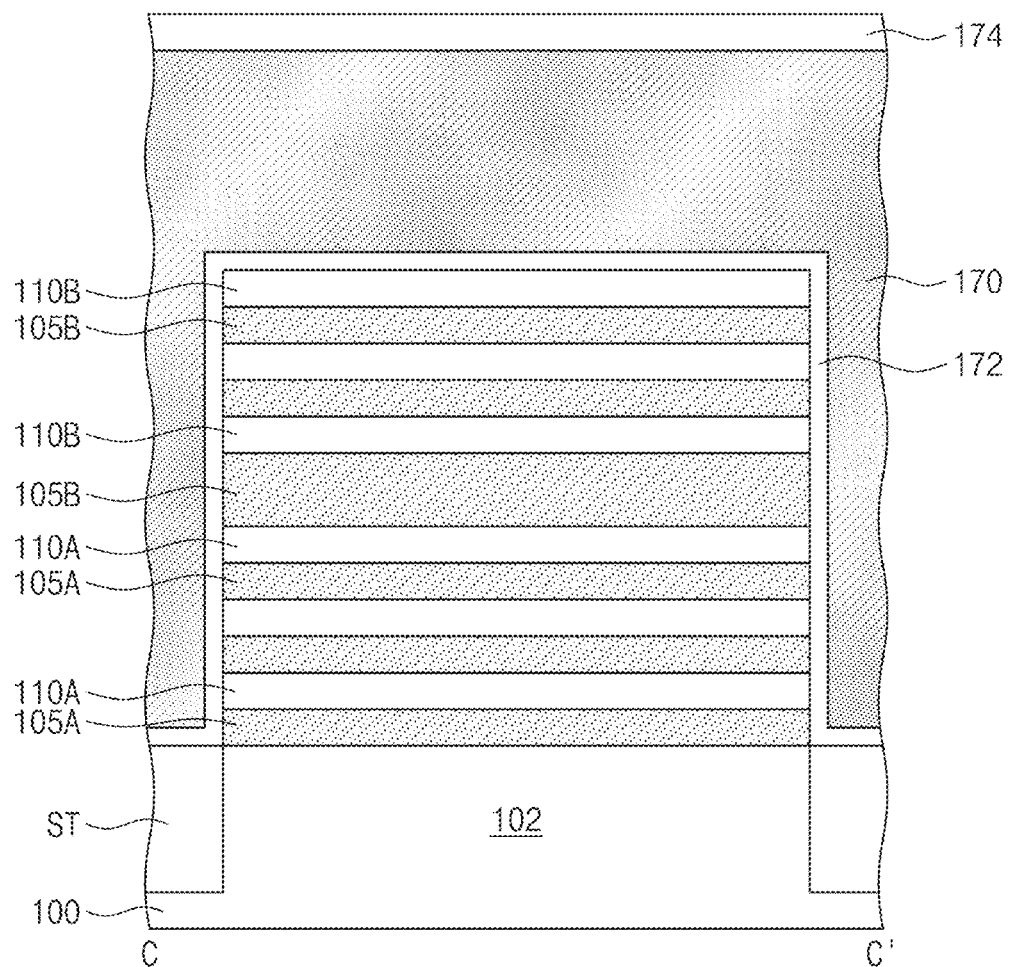
Figure 16:
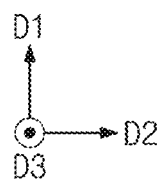

Referring to FIGS. 15 and 16, a first barrier pattern 122 may be formed by performing an ion implantation process of injecting a first impurity of a first conductivity type into a lower portion of the semiconductor layer 120. The first barrier pattern 122 may be formed of or include a semiconductor material that has the first conductivity type and contains the first impurity. In the case where the first conductivity type is an n-type, the first impurity may be arsenic (As) or phosphorus (P), and in the case where the first conductivity type is a p-type, the first impurity may be boron (B). The first barrier pattern 122 may have a conductivity type that is different from the lower source/drain patterns SDa.

Figure 17:
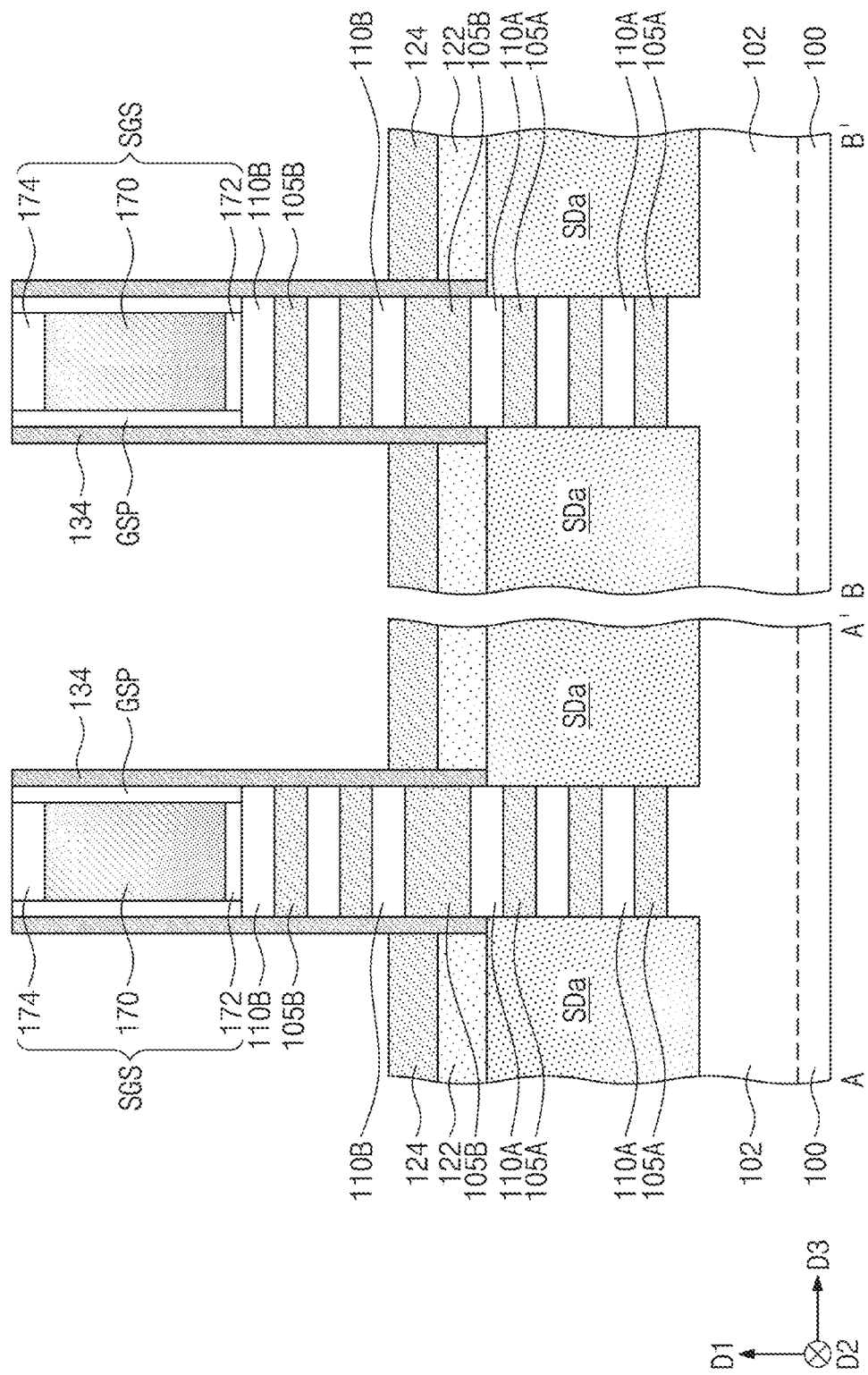
Figure 18:
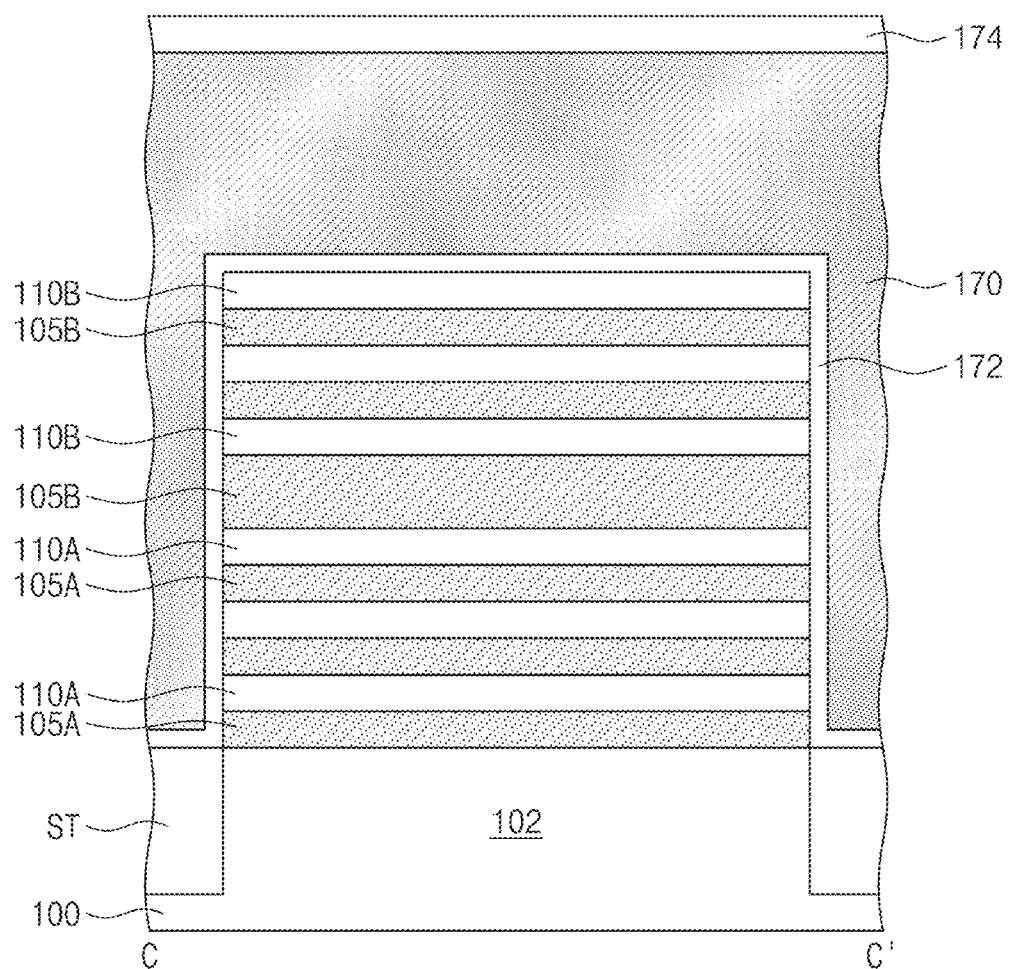
Figure 18:
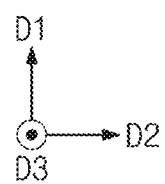

Referring to FIGS. 17 and 18, a second barrier pattern 124 may be formed by performing an ion implantation process of injecting a second impurity of a second conductivity type into an upper portion of the semiconductor layer 120. The second conductivity type may be different from the first conductivity type. The second barrier pattern 124 may be formed of or include a semiconductor material having the second conductivity type and may contain the second impurity. In the case where the second conductivity type is an n-type, the second impurity may be arsenic (As) or phosphorus (P), and in the case where the second conductivity type is a p-type, the second impurity may be boron (B). The lower source/drain patterns SDa may have the second conductivity type and may contain the second impurity. A concentration of the second impurity in the lower source/drain patterns SDa may be higher than a concentration of the second impurity in the second barrier pattern 124.

In an embodiment, unlike that described with reference to FIGS. 13 to 18, the first and second barrier patterns 122 and 124 may be formed by an additional deposition process. As an example, the first barrier pattern 122 may be formed by depositing a first semiconductor layer of the first conductivity type on the lower source/drain patterns SDa, and the first semiconductor layer may contain the first impurity. The second barrier pattern 124 may be formed by depositing a second semiconductor layer of the second conductivity type on the first barrier pattern 122, and the second semiconductor layer may contain the second impurity.

Figure 19:
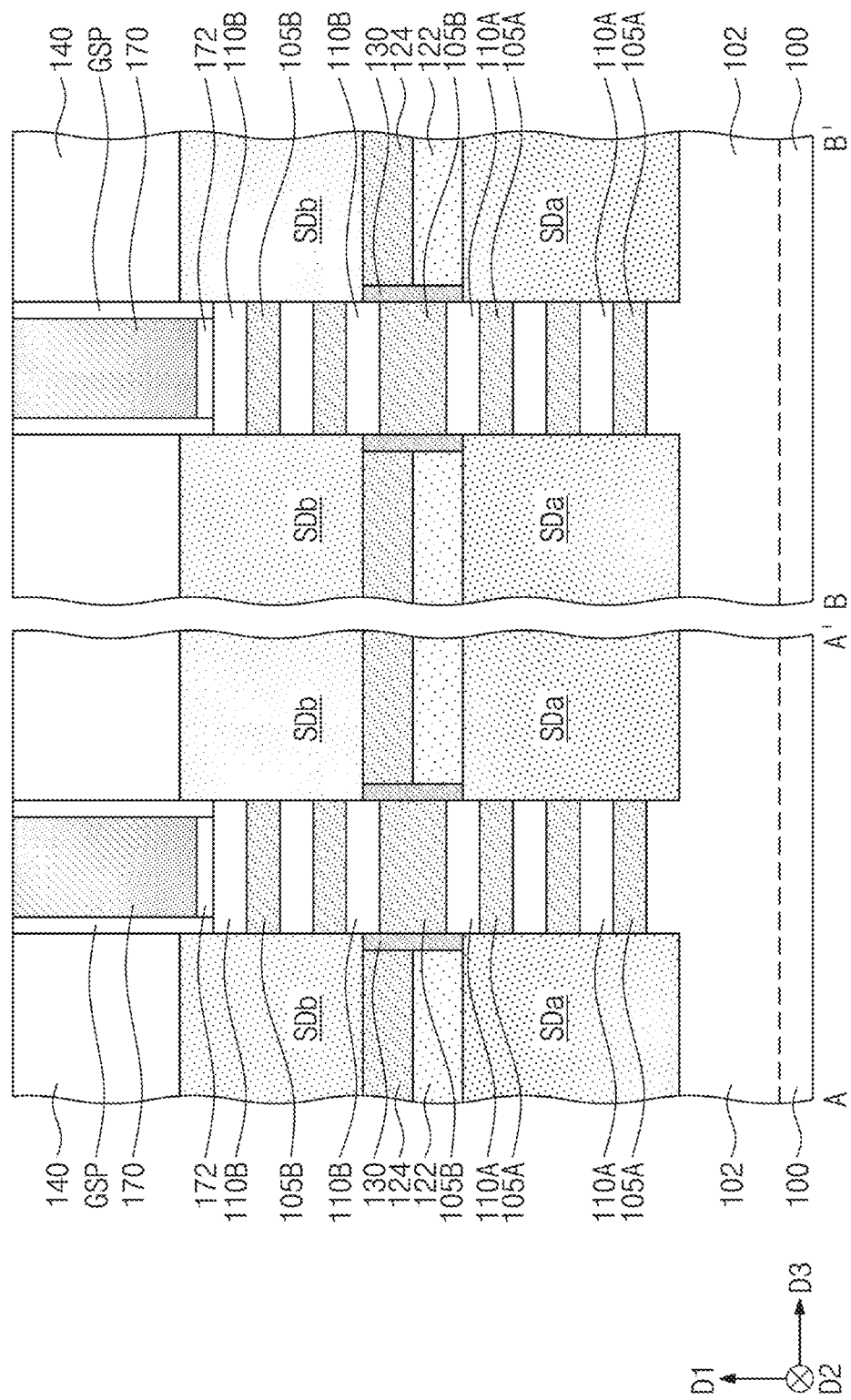
Figure 20:
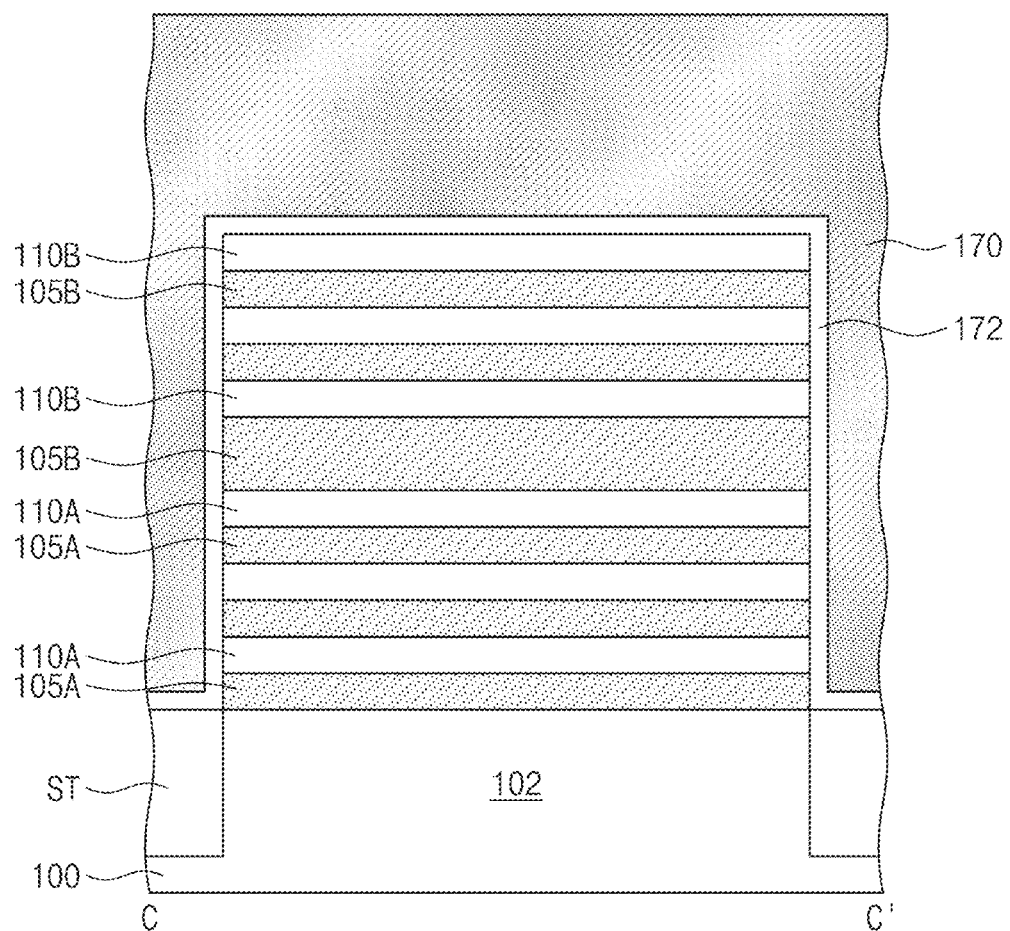

Referring to FIGS. 19 and 20, insulating spacers 130 may be formed by removing upper portions of the preliminary insulating spacers 134. As a result of the removal of the upper portions of the preliminary insulating spacers 134, side surfaces of the gate spacers GSP, the upper sacrificial patterns 105B, and the upper semiconductor patterns 110B may be exposed. The insulating spacers 130 may be interposed between the second barrier pattern 124 and at least one of the upper sacrificial patterns 105B and the upper semiconductor patterns 110B and may be extended into a region between the first barrier pattern 122 and at least one of the upper sacrificial patterns 105B and the lower semiconductor patterns 110A.

Upper source/drain patterns SDb may be formed on the second barrier pattern 124. The upper source/drain patterns SDb may be formed by a second selective epitaxial growth process using the second barrier pattern 124 and the upper semiconductor patterns 110B as a seed layer. The upper source/drain patterns SDb may be doped with impurities, during or after the second selective epitaxial growth process. The impurities may be used to improve electric characteristics of a transistor including the upper source/drain patterns SDb. In the case where the transistor is an NMOSFET, the impurity may be, for example, arsenic (As) or phosphorus (P), and in the case where the transistor is a PMOSFET, the impurity may be, for example, boron (B). The upper sacrificial patterns 105B and the upper semiconductor patterns 110B may be interposed between the upper source/drain patterns SDb.

The upper source/drain patterns SDb may have a conductivity type that is different from the second barrier pattern 124. The upper source/drain patterns SDb may have the first conductivity type and may contain the first impurity. A concentration of the first impurity in the upper source/drain patterns SDb may be higher than a concentration of the first impurity in the first barrier pattern 122.

A first interlayer insulating layer 140 may be formed on the upper source/drain patterns SDb to cover the sacrificial gate structure SGS and the gate spacers GSP. In an embodiment, the formation of the first interlayer insulating layer 140 may include forming an insulating layer on the substrate 100 to cover the upper source/drain patterns SDb, the sacrificial gate structure SGS, and the gate spacers GSP and planarizing the insulating layer to expose the sacrificial gate pattern 170. The mask pattern 174 may be removed by the planarization process.

Figure 21:
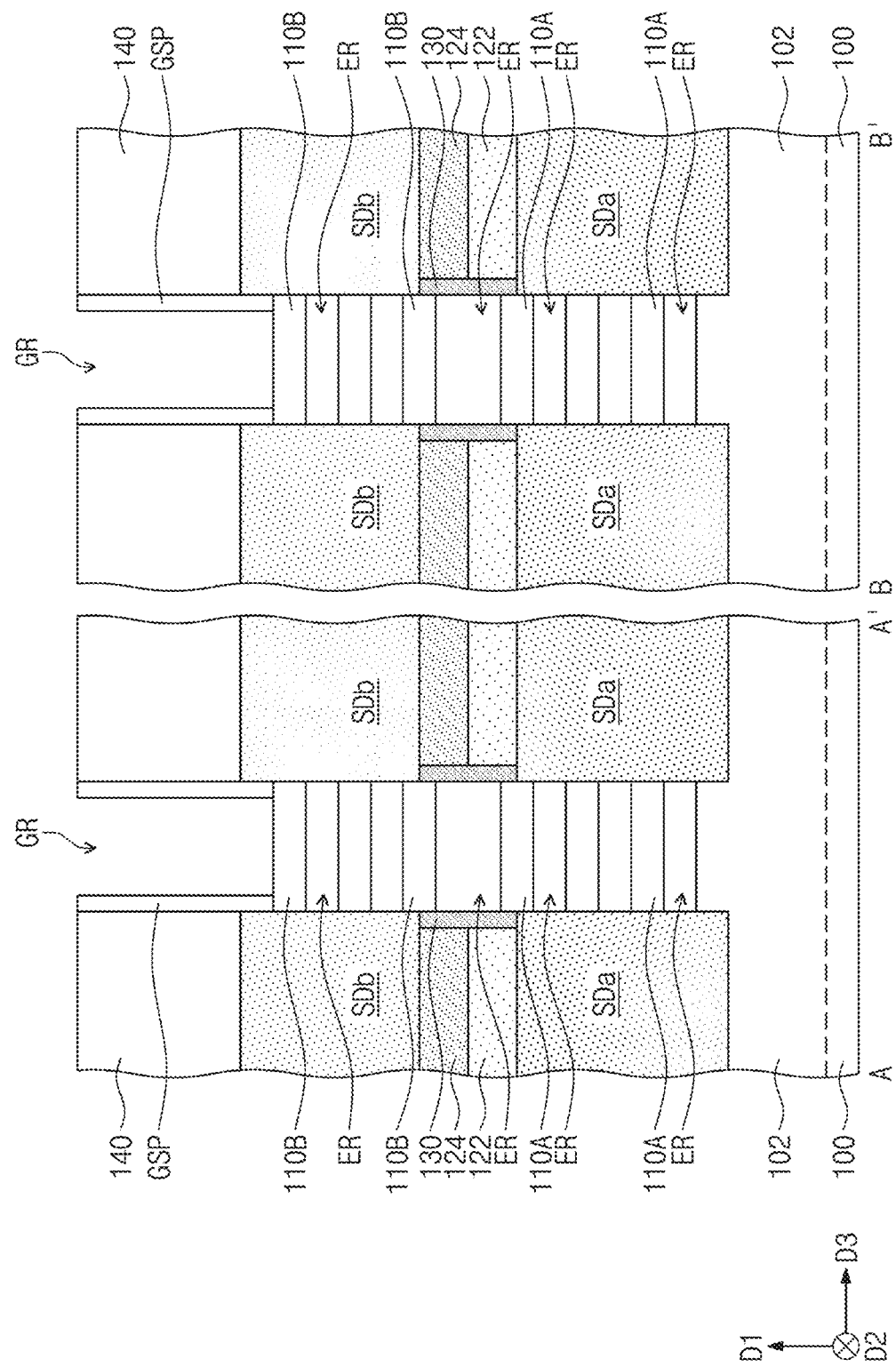
Figure 22:
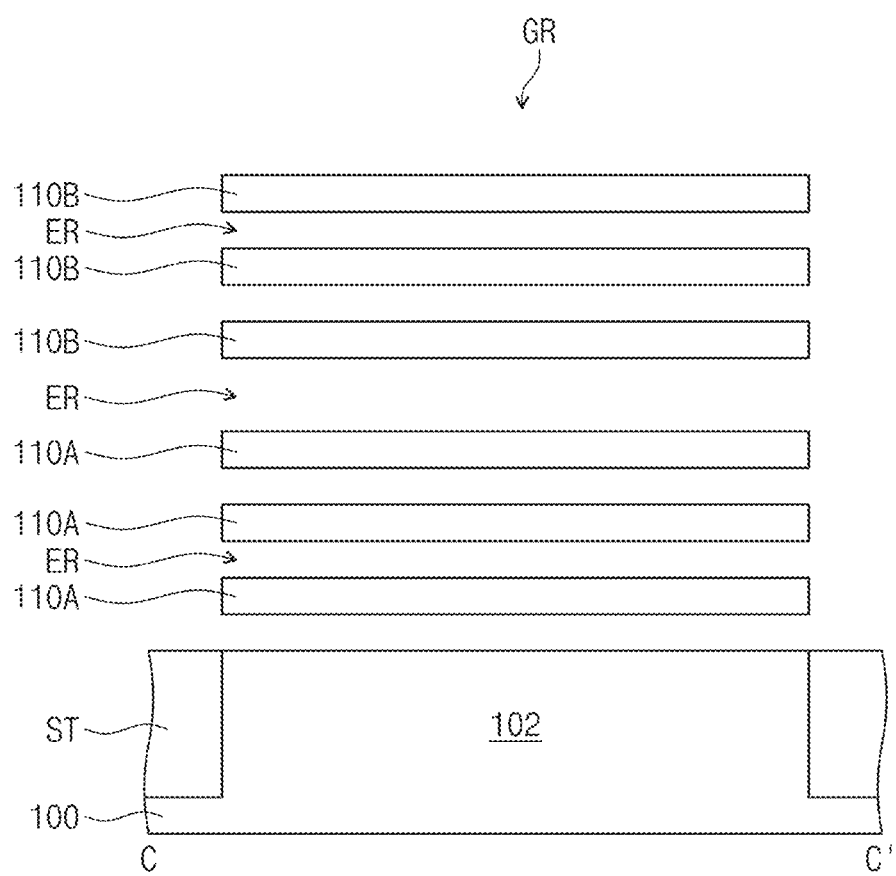

Referring to FIGS. 21 and 22, the sacrificial gate pattern 170 and the etch stop pattern 172 may be removed, and thus, a gap region GR may be formed in the first interlayer insulating layer 140. The gap region GR may be an empty region between the gate spacers GSP. The gap region GR may be formed to expose the lower and upper sacrificial patterns 105A and 105B and the lower and upper semiconductor patterns 110A and 110B.

The exposed lower and upper sacrificial patterns 105A and 105B may be selectively removed. In the case where the lower and upper sacrificial patterns 105A and 105B include silicon-germanium (SiGe) and the lower and upper semiconductor patterns 110A and 110B include silicon (Si), the lower and upper sacrificial patterns 105A and 105B may be selectively removed by performing a wet etching process, in which peracetic acid is used as an etching source. As a result of the selective removal of the lower and upper sacrificial patterns 105A and 105B, empty regions ER may be formed between the lower and upper semiconductor patterns 110A and 110B. Each of the empty regions ER may be connected to the gap region GR.

Figure 23:
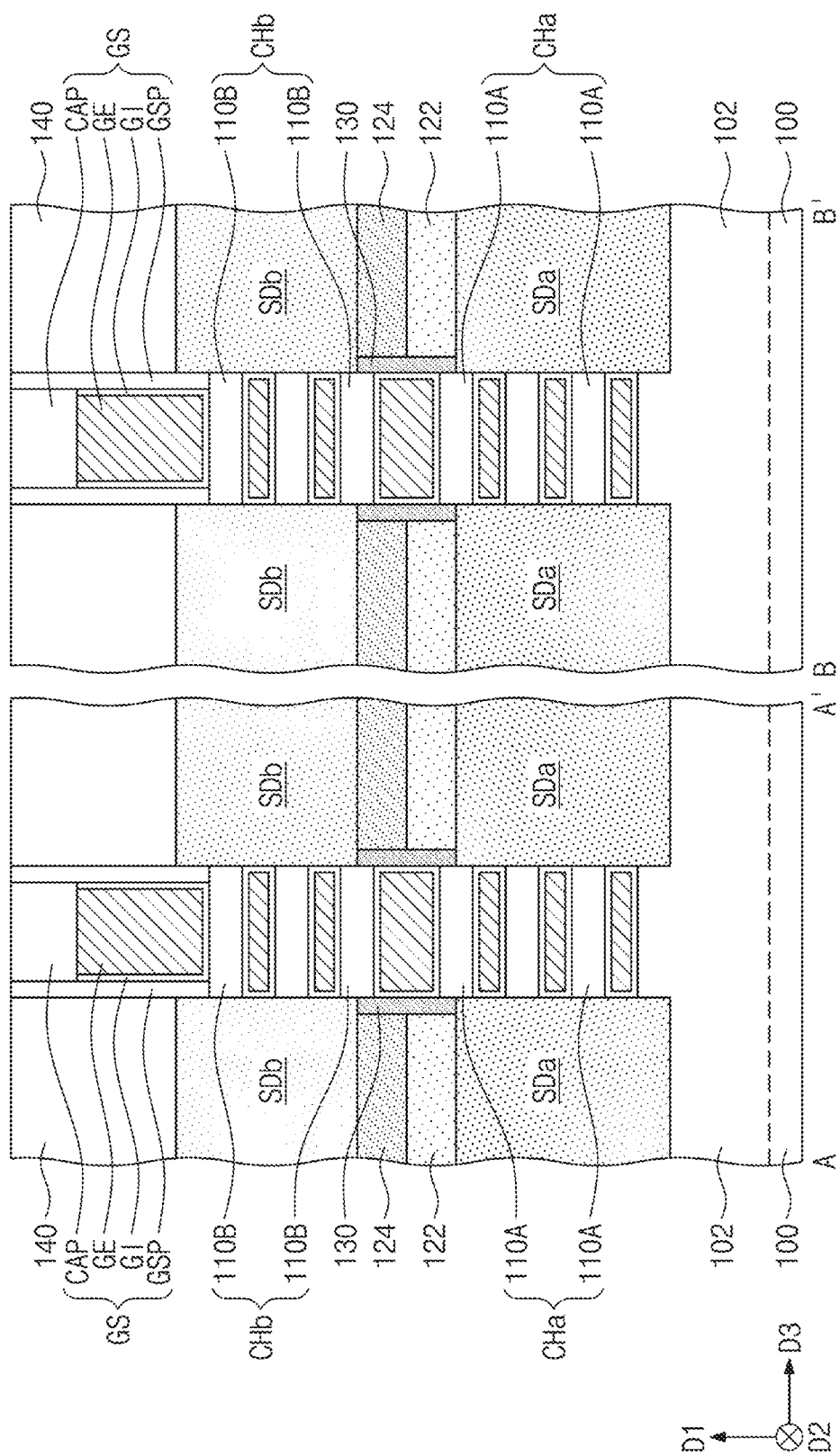
Figure 24:
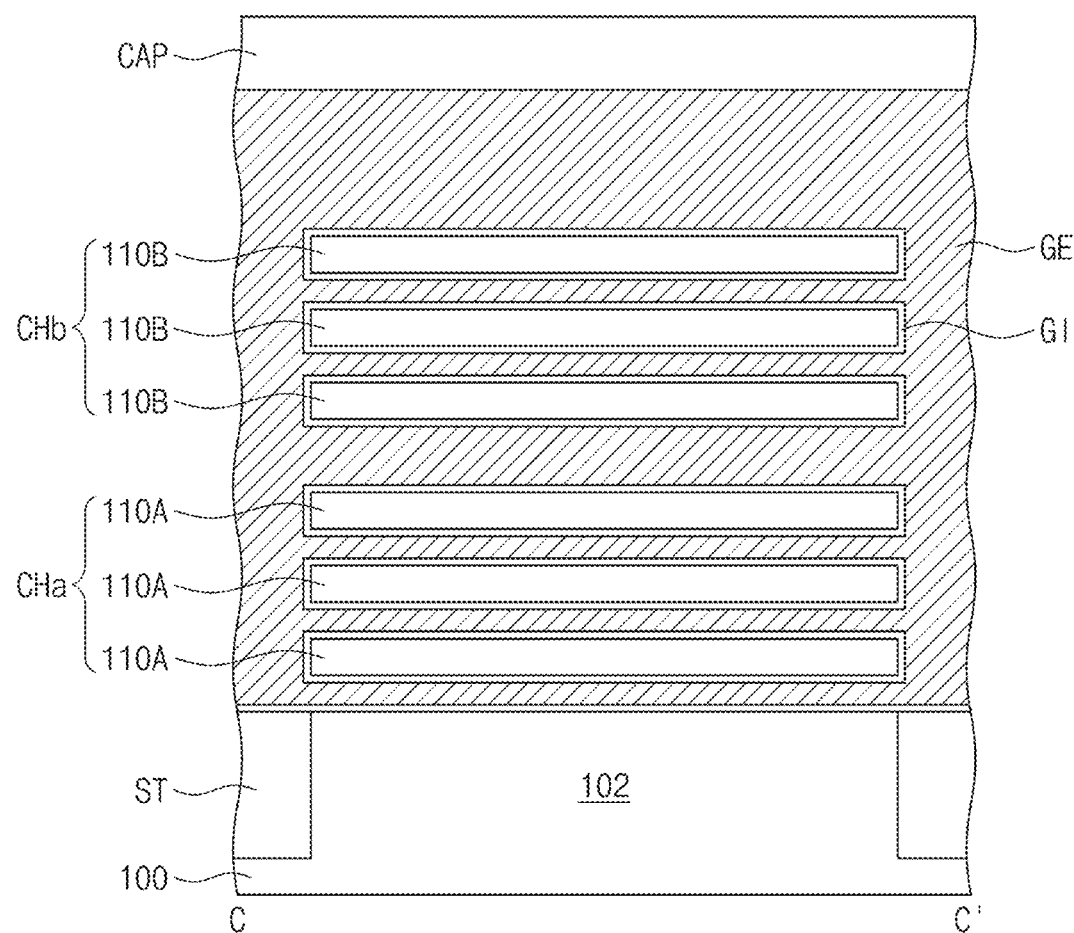

Referring to FIGS. 23 and 24, a gate insulating pattern GI and a gate electrode GE may be formed to fill the gap region GR and the empty regions ER. The formation of the gate insulating pattern GI and the gate electrode GE may include forming a gate insulating layer to conformally cover inner surfaces of the gap region GR and the empty regions ER, forming a gate electrode layer to fill the gap region GR and the empty regions ER covered with the gate insulating layer, and planarizing the gate insulating layer and the gate electrode layer to expose the first interlayer insulating layer 140. As a result of the planarization process, the gate insulating pattern GI and the gate electrode GE may be locally formed in the gap region GR and the empty regions ER.

A groove region may be formed between the gate spacers GSP by recessing upper portions of the gate insulating pattern GI and the gate electrode GE. A gate capping pattern CAP may be formed in the groove region. The formation of the gate capping pattern CAP may include forming a gate capping layer on the first interlayer insulating layer 140 to fill the groove region and planarizing the gate capping layer to expose the first interlayer insulating layer 140. The gate insulating pattern GI, the gate electrode GE, the gate capping pattern CAP, and the gate spacers GSP may constitute a gate structure GS.

Referring back to FIGS. 1 to 3, a second interlayer insulating layer 150 may be formed on the first interlayer insulating layer 140 to cover the top surface of the gate capping pattern CAP. A common electrode 160 may be formed at a side of the gate structure GS. In an embodiment, the formation of the common electrode 160 may include forming a penetration hole to penetrate the first and second interlayer insulating layers 140 and 150, one of the upper source/drain patterns SDb, and the first and second barrier patterns 122 and 124 and to expose one of the lower source/drain patterns SDa, forming a common electrode layer on the second interlayer insulating layer 150 to fill the penetration hole, and planarizing the common electrode layer to expose the second interlayer insulating layer 150. As a result of the planarization of the common electrode layer, the common electrode 160 may be locally formed in the penetration hole. The common electrode 160 may be formed to be electrically connected to the one of the upper source/drain patterns SDb and the one of the lower source/drain patterns SDa.

An upper electrode 162, a lower electrode 164, and an insulating sidewall pattern 166 may be formed at an opposite side of the gate structure GS. In an embodiment, the formation of the upper electrode 162 may include forming an upper hole to penetrate the first and second interlayer insulating layers 140 and 150 and to expose the other of the upper source/drain patterns SDb, forming an upper electrode layer on the second interlayer insulating layer 150 to fill the upper hole, and planarizing the upper electrode layer to expose the second interlayer insulating layer 150. As a result of the planarization of the upper electrode layer, the upper electrode 162 may be locally formed in the upper hole. The upper electrode 162 may be formed to be electrically connected to the other of the upper source/drain patterns SDb.

In an embodiment, the formation of the lower electrode 164 and the insulating sidewall pattern 166 may include forming a lower hole to penetrate the first and second interlayer insulating layers 140 and 150, the other of the upper source/drain patterns SDb, and the first and second barrier patterns 122 and 124 and to expose other of the lower source/drain patterns SDa, forming the insulating sidewall pattern 166 to cover an inner side surface of the lower hole, forming a lower electrode layer on the second interlayer insulating layer 150 to fill a remaining portion of the lower hole, and planarizing the lower electrode layer to expose the second interlayer insulating layer 150. In an embodiment, the formation of the insulating sidewall pattern 166 may include forming an insulating sidewall layer to conformally cover an inner surface of the lower hole and anisotropically etching the insulating sidewall layer. As a result of the planarization of the lower electrode layer, the lower electrode 164 may be locally formed in the lower hole. The lower electrode 164 may be formed to be electrically connected to the other of the lower source/drain patterns SDa.

Figure 25:
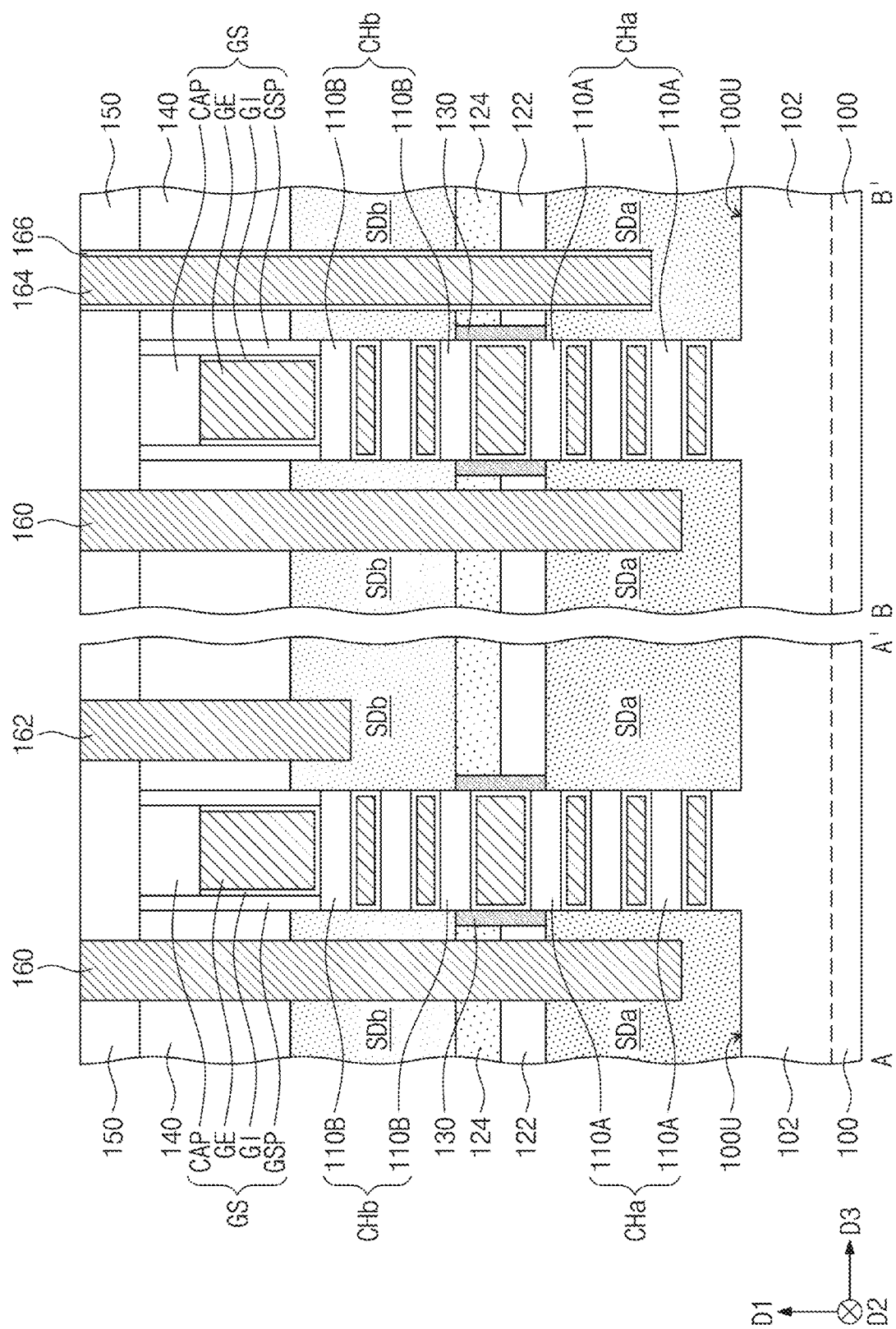
FIG. 25 is a sectional view, which illustrates a semiconductor device according to an embodiment of the inventive concepts and corresponds to the lines A-A' and B-B' of FIG. 1.
Figure 26:
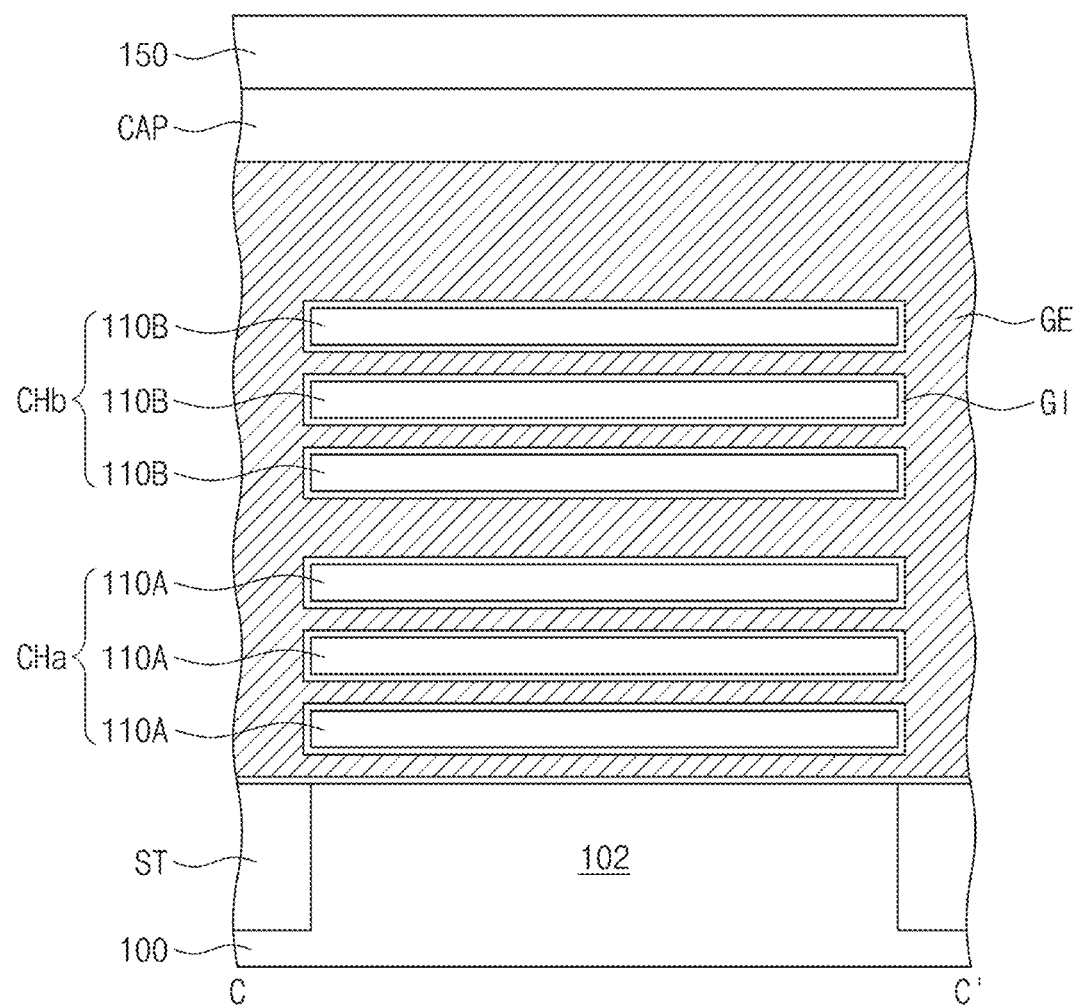
FIG. 26 is a sectional view, which illustrates a semiconductor device according to an embodiment of the inventive concepts and corresponds to the line C-C' of FIG. 1.

FIG. 25 is a sectional view, which illustrates a semiconductor device according to an embodiment of the inventive concepts and corresponds to the lines A-A' and B-B' of FIG. 1. FIG. 26 is a sectional view, which illustrates a semiconductor device according to an embodiment of the inventive concepts and corresponds to the line C-C' of FIG. 1. For the sake of brevity, features, which are different from the semiconductor device described with reference to FIGS. 1 to 4, will be mainly described below.

Referring to FIGS. 25 and 26, the first and second barrier patterns 122 and 124 may be formed of or include different materials from each other. In an embodiment, the first barrier pattern 122 may be formed of or include an insulating material (e.g., silicon oxide). The second barrier pattern 124 may be formed of or include an insulating material doped with a semiconductor element. The semiconductor element may be, for example, silicon (Si) or germanium (Ge). As an example, the second barrier pattern 124 may include silicon oxide that is doped with silicon (Si) or germanium (Ge). A content of the semiconductor element in the second barrier pattern 124 may be higher than a content of the semiconductor element in the first barrier pattern 122. The first barrier pattern may include a first material and the second barrier pattern may include a second material. The first material and the second material may be different. The lower source/drain patterns SDa may have a conductivity type that is the same as or different from the upper source/drain patterns SDb.

According to an embodiment of the inventive concepts, since the first barrier pattern 122 includes an insulating material, the upper source/drain patterns SDb may be electrically disconnected from the lower source/drain patterns SDa by at least the first barrier pattern 122. Accordingly, it may be possible to realize an electric disconnection between the lower transistor including the lower source/drain patterns SDa and the upper transistor including the upper source/drain patterns SDb. In addition, since the second barrier pattern 124 includes an insulating material doped with the semiconductor element, the second barrier pattern 124 may be used as a seed layer in an epitaxial growth process for forming the upper source/drain patterns SDb. Accordingly, the upper source/drain patterns SDb may be easily grown using the second barrier pattern 124 and the upper semiconductor patterns 110B as a seed layer, and as a result, it may be possible to prevent the upper transistor, which includes the upper source/drain patterns SDb, from being deteriorated. Accordingly, it may be possible to easily fabricate the stacked transistors with improved performance.

Figure 27:
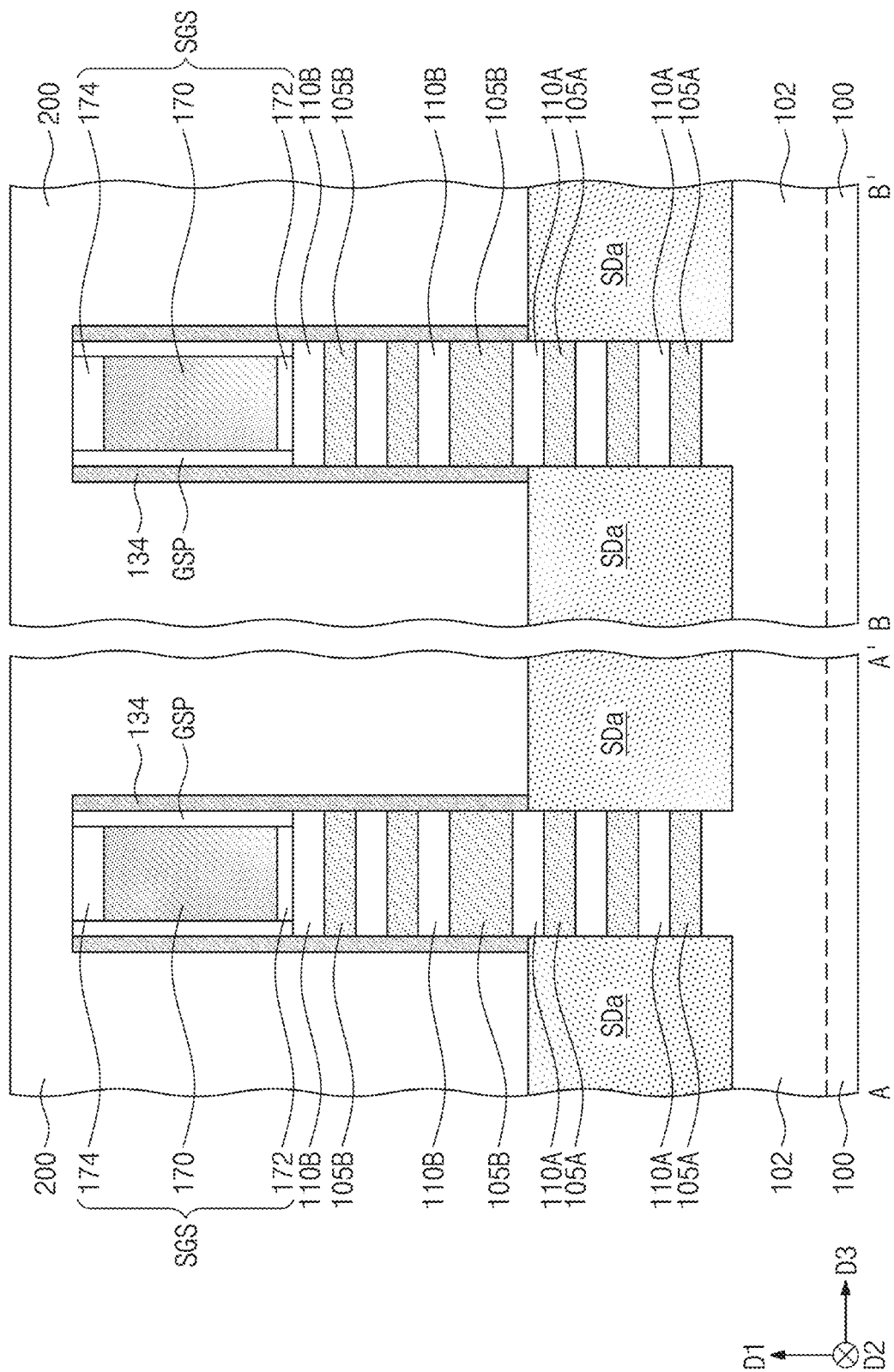
FIGS. 27, 29, and 31 are sectional views, which illustrate a method of fabricating a semiconductor device according to an embodiment of the inventive concepts and correspond to the lines A-A' and B-B' of FIG. 1.
Figure 28:
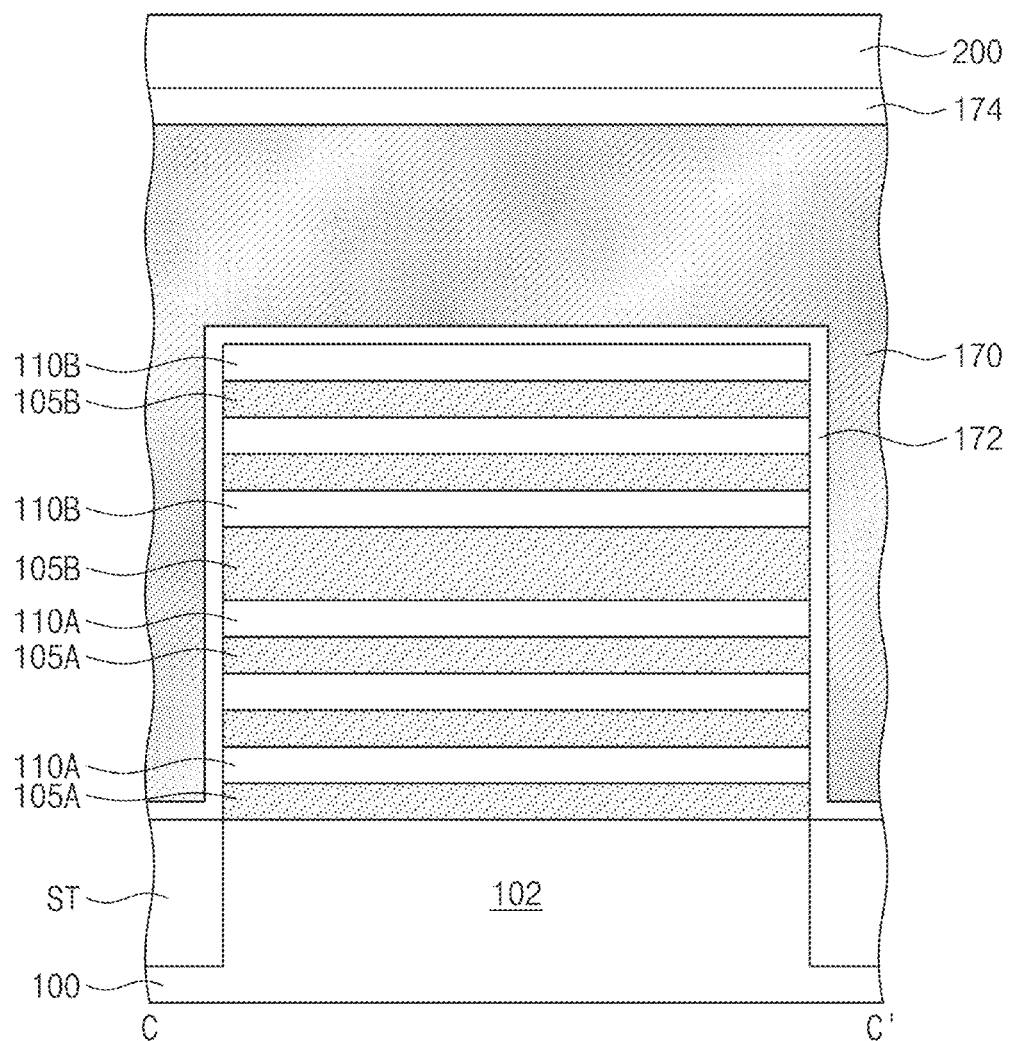
FIGS. 28, 30, and 32 are sectional views, which illustrate a method of fabricating a semiconductor device according to an embodiment of the inventive concepts and correspond to the line C-C' of FIG. 1.
Figure 28:
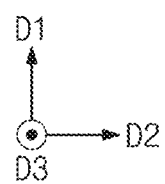
Figure 29:
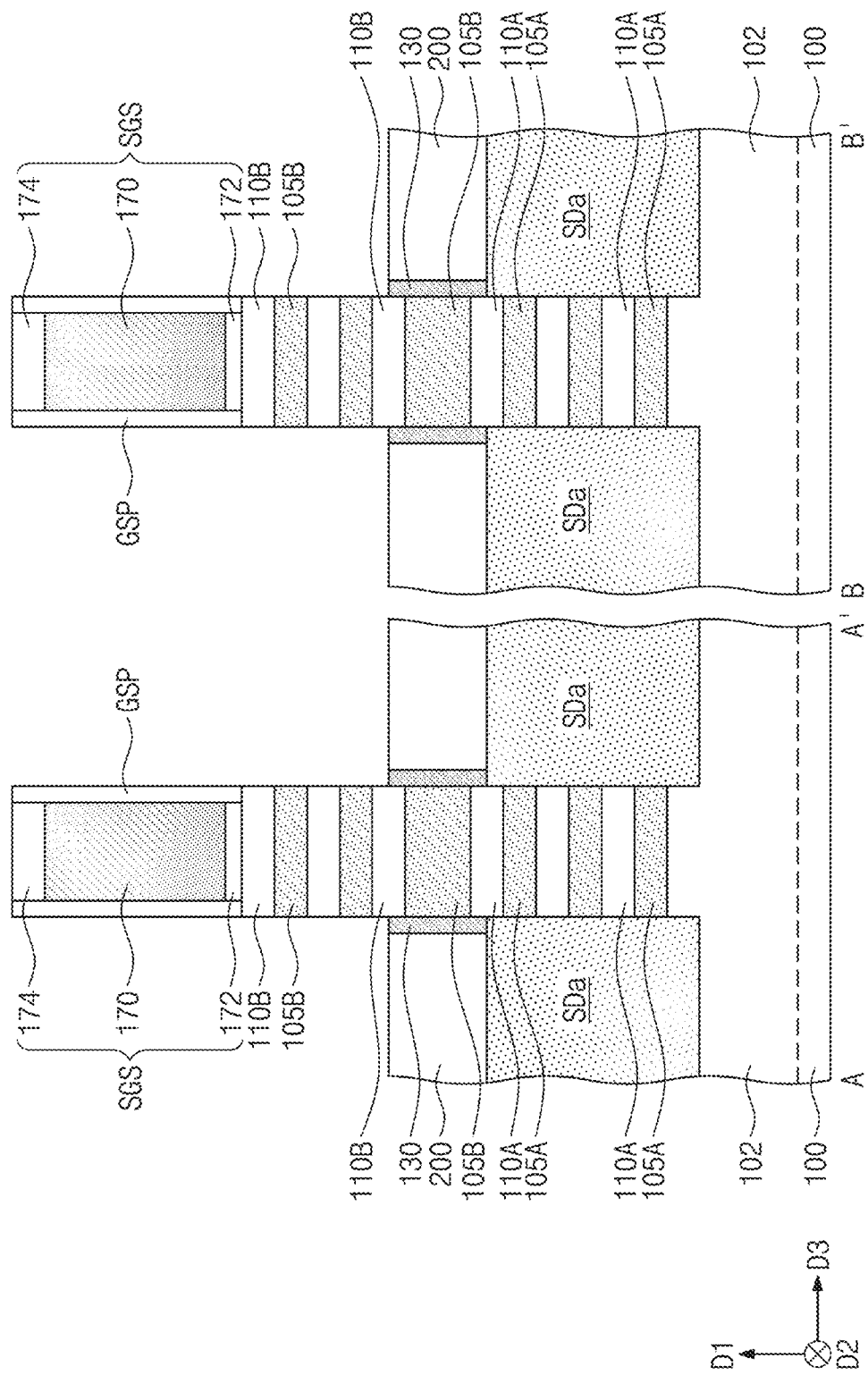
Figure 30:
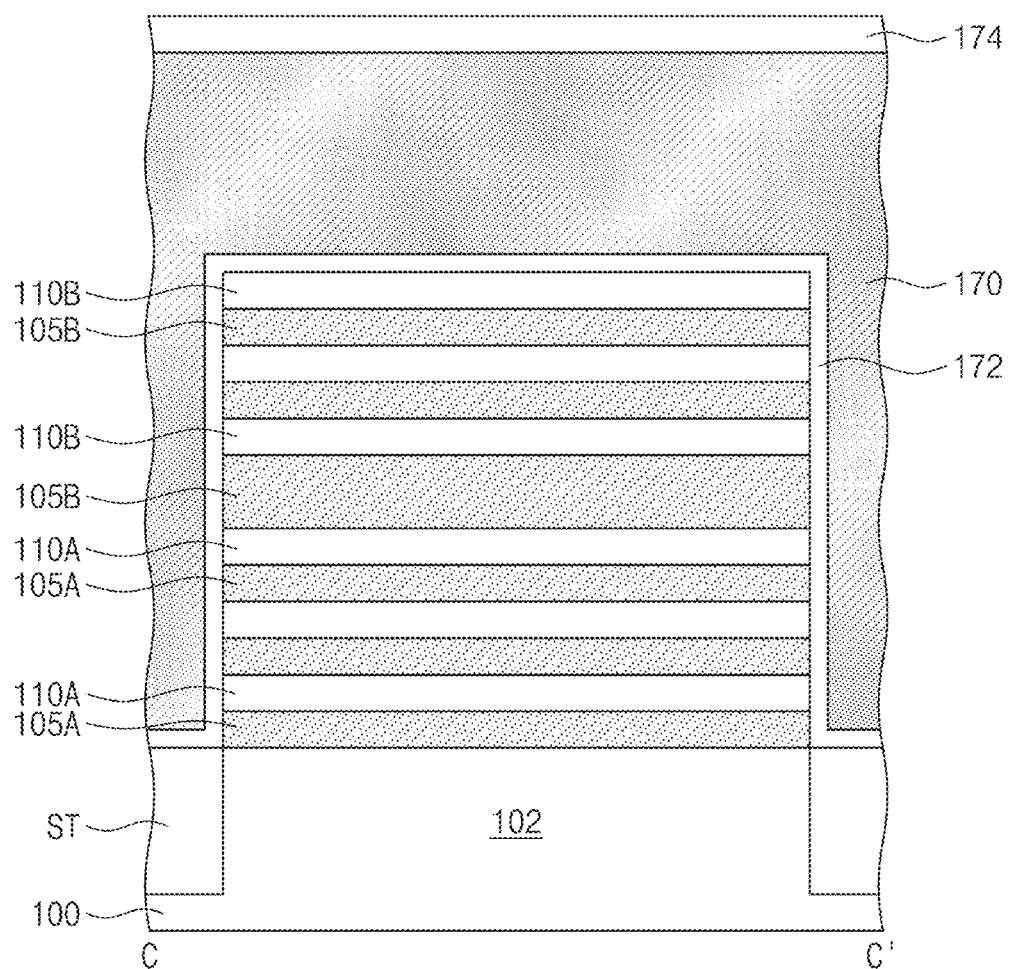
Figure 30:
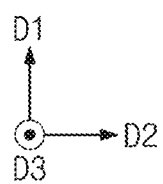
Figure 31:
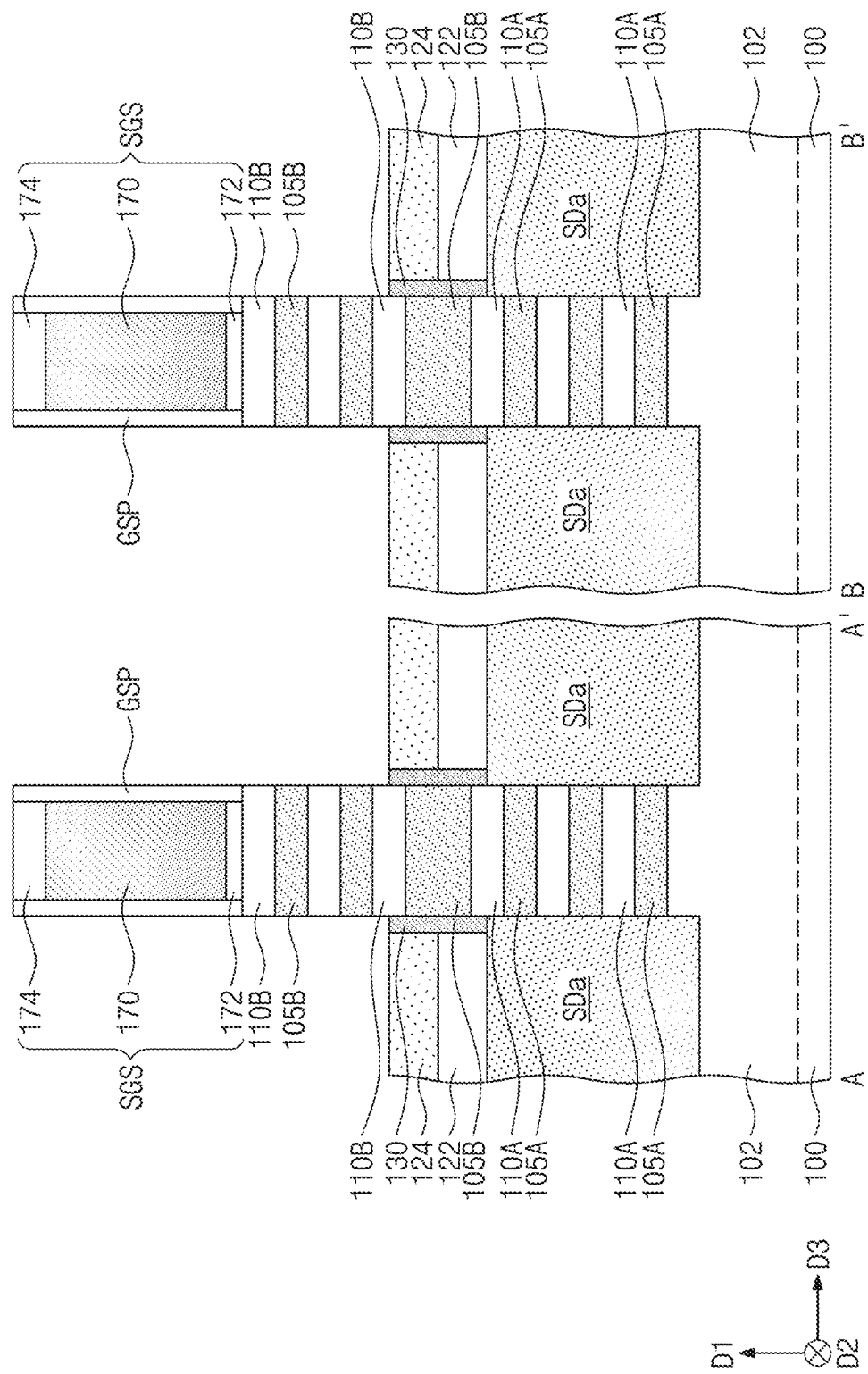
Figure 32:
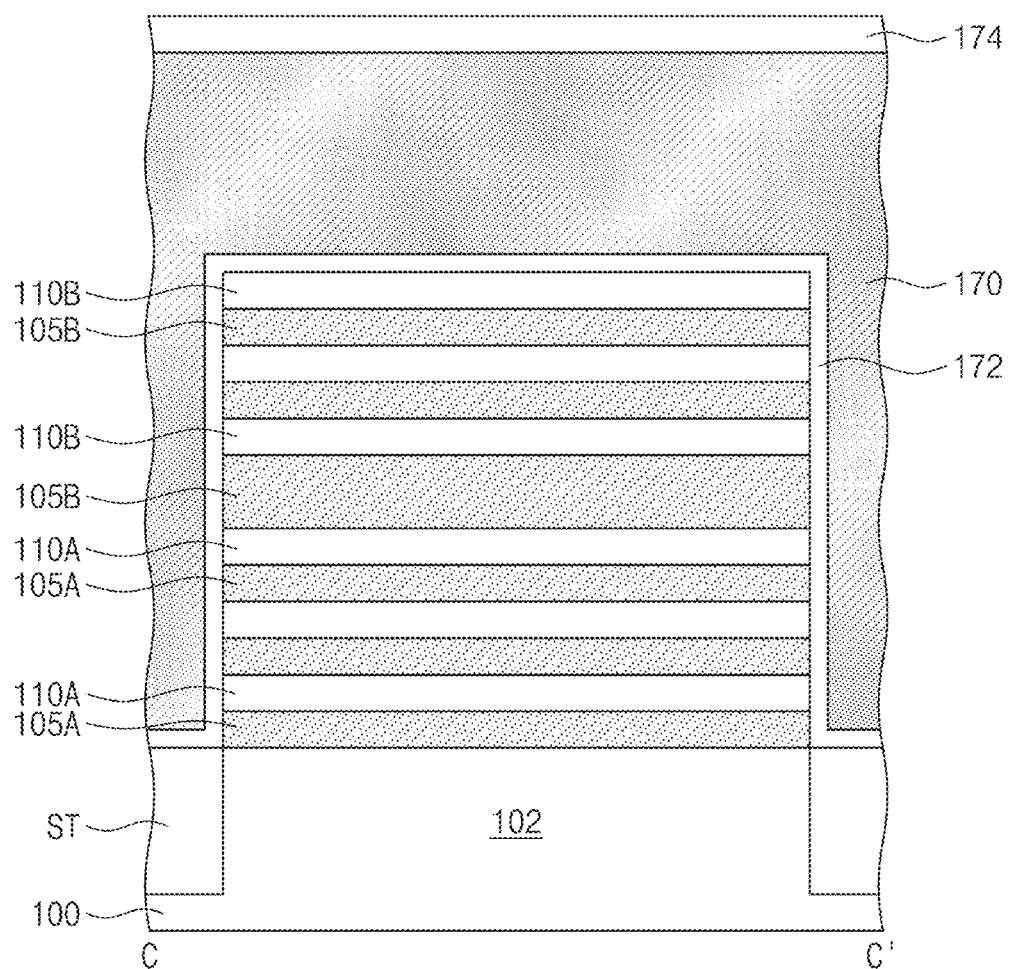

FIGS. 27, 29, and 31 are sectional views, which illustrate a method of fabricating a semiconductor device according to an embodiment of the inventive concepts and correspond to the lines A-A' and B-B' of FIG. 1. FIGS. 28, 30, and 32 are sectional views, which illustrate a method of fabricating a semiconductor device according to an embodiment of the inventive concepts and correspond to the line C-C' of FIG. 1. For the sake of brevity, features, which are different from the fabrication method described with reference to FIGS. 5 to 24, will be mainly described below.

First, as described with reference to FIGS. 11 and 12, the lower source/drain patterns SDa may be formed on the active region 102 of the substrate 100. The lower source/drain patterns SDa may be formed by a first selective epitaxial growth process using the substrate 100 and the lower semiconductor patterns 110A as a seed layer. The lower sacrificial patterns 105A and the lower semiconductor patterns 110A may be interposed between the lower source/drain patterns SDa.

Referring to FIGS. 27 and 28, an insulating layer 200 may be formed on the lower source/drain patterns SDa to cover the sacrificial gate structure SGS and the preliminary insulating spacers 134. The insulating layer 200 may be formed of or include an insulating material (e.g., silicon oxide).

Referring to FIGS. 29 and 30, the insulating layer 200 may be recessed until the insulating layer 200 has a specific thickness. Insulating spacers 130 may be formed by removing upper portions of the preliminary insulating spacers 134. As a result of the removal of the upper portions of the preliminary insulating spacers 134, side surfaces of the gate spacers GSP, the upper sacrificial patterns 105B, and the upper semiconductor patterns 110B may be exposed. The insulating spacers 130 may be interposed between the insulating layer 200 and at least one of the upper sacrificial patterns 105B, the upper semiconductor patterns 110B, and the lower semiconductor patterns 110A.

Referring to FIGS. 31 and 32, an ion implantation process may be performed to inject a semiconductor element into an upper portion of the insulating layer 200. The lower portion of the insulating layer 200 may be referred to as a first barrier pattern 122, and the upper portion of the insulating layer 200, in which the semiconductor element is injected, may be referred to as a second barrier pattern 124. The semiconductor element may be, for example, silicon (Si) or germanium (Ge). A content of the semiconductor element in the second barrier pattern 124 may be higher than a content of the semiconductor element in the first barrier pattern 122.

After the formation of the first and second barrier patterns 122 and 124, upper source/drain patterns SDb may be formed on the second barrier pattern 124, as described with reference to FIGS. 19 and 20. The upper source/drain patterns SDb may be formed by a second selective epitaxial growth process using the second barrier pattern 124 and the upper semiconductor patterns 110B as a seed layer. The upper sacrificial patterns 105B and the upper semiconductor patterns 110B may be interposed between the upper source/drain patterns SDb. The upper source/drain patterns SDb may have a conductivity type that is different from or the same as the lower source/drain patterns SDa. A subsequent process may be performed in the same manner as the fabrication method described with reference to FIGS. 5 to 24.

Figure 33:
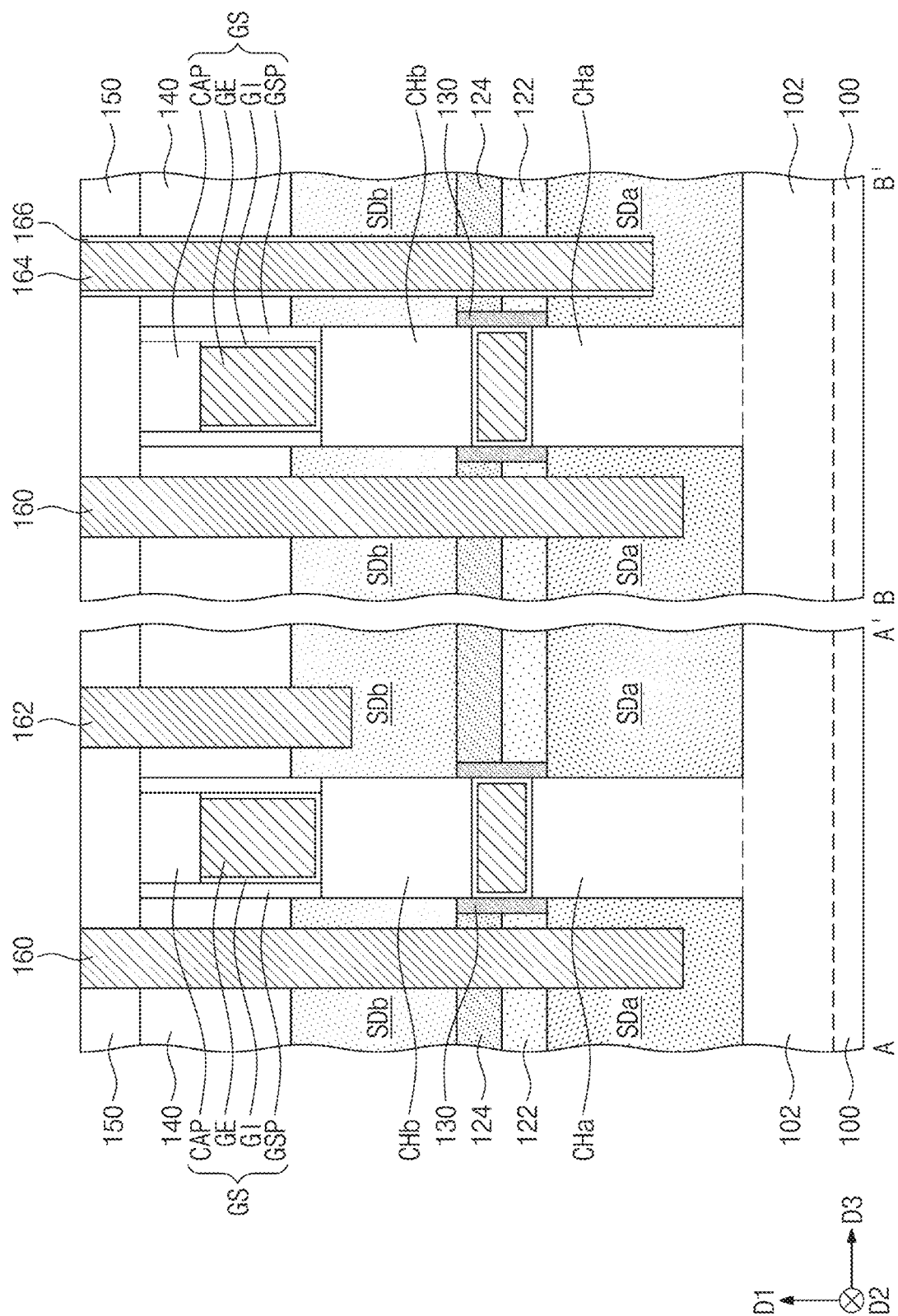
FIG. 33 is a sectional view, which illustrates a semiconductor device according to an embodiment of the inventive concepts and corresponds to the lines A-A' and B-B' of FIG. 1.
Figure 34:
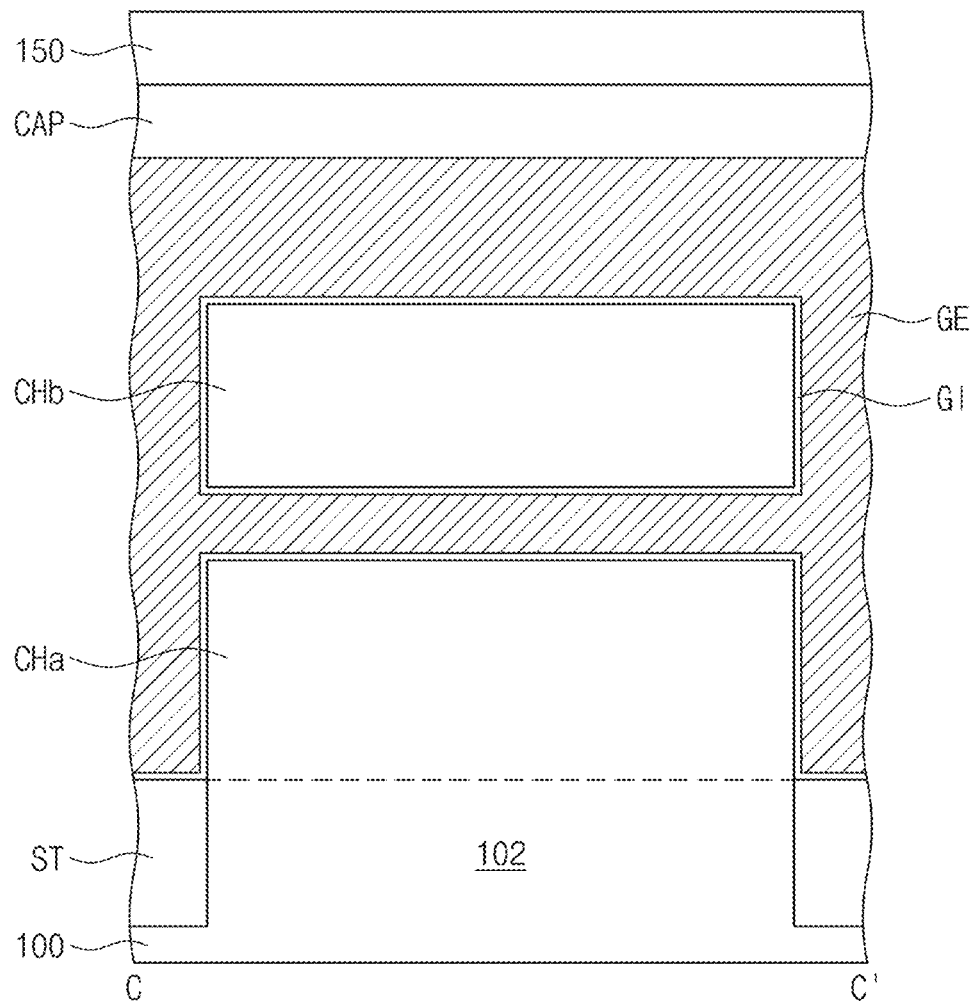
FIG. 34 is a sectional view, which illustrates a semiconductor device according to an embodiment of the inventive concepts and corresponds to the line C-C' of FIG. 1.
Figure 34:
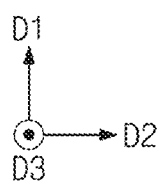

FIG. 33 is a sectional view, which illustrates a semiconductor device according to an embodiment of the inventive concepts and corresponds to the lines A-A' and B-B' of FIG. 1. FIG. 34 is a sectional view, which illustrates a semiconductor device according to an embodiment of the inventive concepts and corresponds to the line C-C' of FIG. 1. For the sake of brevity, features, which are different from the semiconductor device described with reference to FIGS. 1 to 4, will be mainly described below.

Referring to FIGS. 33 and 34, a lower channel pattern CHa and an upper channel pattern CHb may be stacked on the active region 102 of the substrate 100. The lower and upper channel patterns CHa and CHb may be sequentially stacked in the first direction D1 that is perpendicular to the top surface 100U of the substrate 100.

In an embodiment, the lower channel pattern CHa may be a single channel pattern, which extends in the first direction D1, and the upper channel pattern CHb may be a single channel pattern, which extends in the first direction D1. The upper channel pattern CHb may be spaced apart from the lower channel pattern CHa in the first direction D1. Each of the lower and upper channel patterns CHa and CHb may be formed of or include at least one of silicon (Si), silicon germanium (SiGe), or germanium (Ge).

The lower source/drain patterns SDa may be disposed on the active region 102 of the substrate 100. The lower source/drain patterns SDa may be disposed at both sides of the lower channel pattern CHa and may be connected to the lower channel pattern CHa. The lower source/drain patterns SDa may be spaced apart from each other in the third direction D3 with the lower channel pattern CHa interposed therebetween. The lower source/drain patterns SDa may be epitaxial patterns that are formed using the substrate 100 and the lower channel pattern CHa as a seed layer. The lower source/drain patterns SDa may be configured to exert a tensile strain or compressive strain on the lower channel pattern CHa.

The upper source/drain patterns SDb may be disposed on the active region 102 of the substrate 100 and may be stacked on the lower source/drain patterns SDa. The upper source/drain patterns SDb may be stacked on the lower source/drain patterns SDa in the first direction D1 and may be spaced apart from the lower source/drain patterns SDa in the first direction D1. The upper source/drain patterns SDb may be disposed at both sides of the upper channel pattern CHb and may be connected to the upper channel pattern CHb. The upper source/drain patterns SDb may be spaced apart from each other in the third direction D3, with the upper channel pattern CHb interposed therebetween. The upper source/drain patterns SDb may be epitaxial patterns which are formed using the second barrier pattern 124 and the upper channel pattern CHb as a seed. The upper source/drain patterns SDb may be configured to exert a tensile strain or compressive strain on the upper channel pattern CHb.

The gate structure GS may be disposed on the upper channel pattern CHb to cover the upper and lower channel patterns CHb and CHa. The gate structure GS may be extended in the second direction D2 to cover side surfaces of the upper channel pattern CHb, which are opposite to each other in the second direction D2, and side surfaces of the lower channel pattern CHa, which are opposite to each other in the second direction D2. The gate electrode GE of the gate structure GS may be disposed on the upper channel pattern CHb and may be extended in the second direction D2. The gate electrode GE may cover side surfaces of the upper channel pattern CHb, which are opposite to each other in the second direction D2, and side surfaces of the lower channel pattern CHa, which are opposite to each other in the second direction D2. The gate electrode GE may be extended into a region between the upper and lower channel patterns CHb and CHa. The gate insulating pattern GI of the gate structure GS may be interposed between the upper channel pattern CHb and the gate electrode GE and may enclose an outer surface of the upper channel pattern CHb. The gate insulating pattern GI may be interposed between the lower channel pattern CHa and the gate electrode GE and may be extended in a region between the device isolation layer ST and the gate electrode GE.

The insulating spacer 130 may be interposed between a portion of the gate electrode GE, which is located between the upper and lower channel patterns CHb and CHa, and the first barrier pattern 122 and may be extended into a region between the portion of the gate electrode GE and the second barrier pattern 124. The insulating spacer 130 may be interposed between the first barrier pattern 122 and at least one of the lower channel pattern CHa and the gate electrode GE and may be extended into a region between the second barrier pattern 124 and at least one of the upper channel pattern CHb and the gate electrode GE.

The gate electrode GE, the lower channel pattern CHa, and the lower source/drain patterns SDa may constitute a lower transistor, and the gate electrode GE, the upper channel pattern CHb, and the upper source/drain patterns SDb may constitute an upper transistor. In an embodiment, each of the lower and upper transistors may be a fin field effect transistor (FinFET). The lower and upper transistors may be vertically stacked on the substrate 100 and in the first direction D1 and may be called 'stacked transistors'. Except for the afore-described differences, the semiconductor device according to the present embodiments may be substantially the same as the semiconductor device described with reference to FIGS. 1 to 4.

Figure 35:
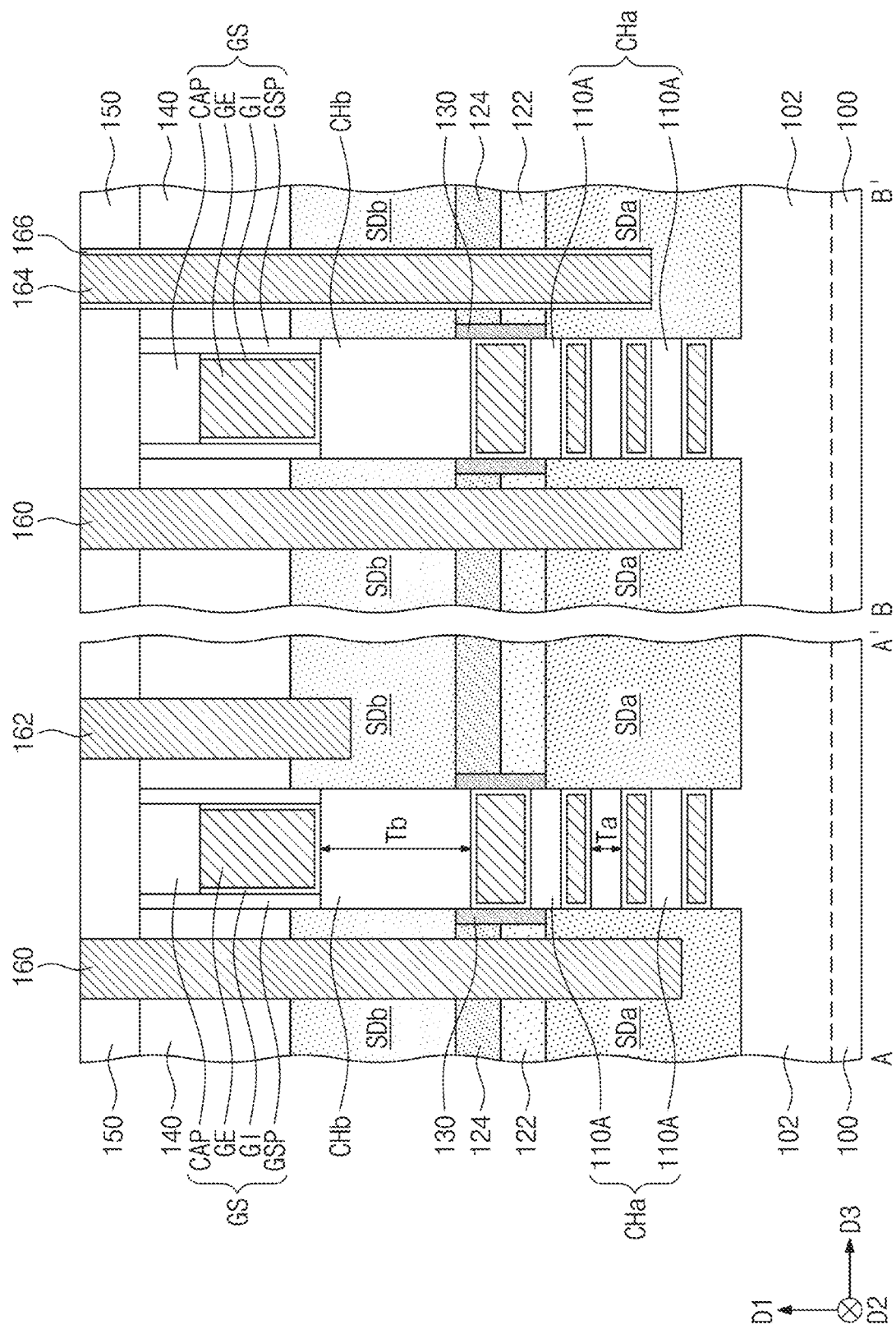
FIG. 35 is a sectional view, which illustrates a semiconductor device according to an embodiment of the inventive concepts and corresponds to the lines A-A' and B-B' of FIG. 1.
Figure 36:
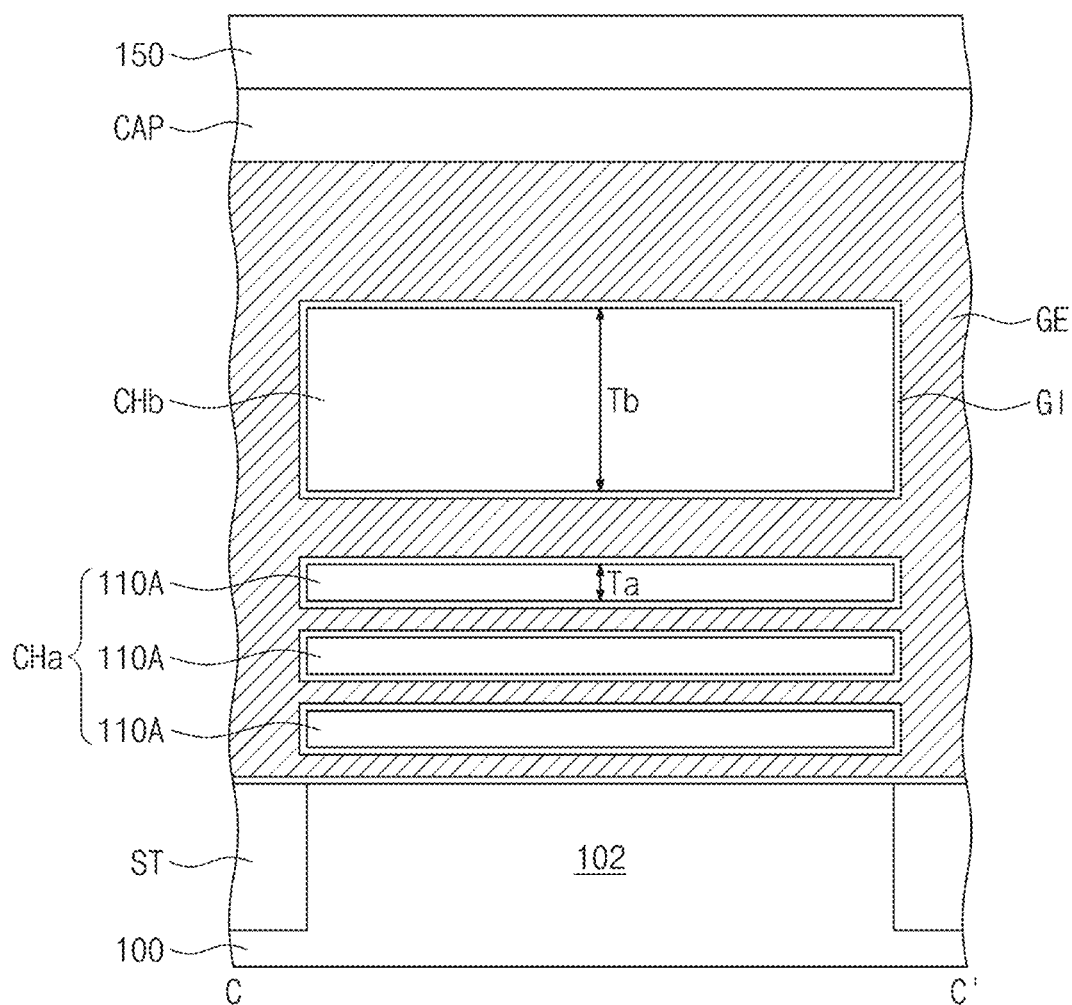
FIG. 36 is a sectional view, which illustrates a semiconductor device according to an embodiment of the inventive concepts and corresponds to the line C-C' of FIG. 1.
Figure 36:
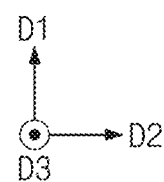

FIG. 35 is a sectional view, which illustrates a semiconductor device according to an embodiment of the inventive concepts and corresponds to the lines A-A' and B-B' of FIG. 1. FIG. 36 is a sectional view, which illustrates a semiconductor device according to an embodiment of the inventive concepts and corresponds to the line C-C' of FIG. 1. For the sake of brevity, features, which are different from the semiconductor device described with reference to FIGS. 1 to 4, will be mainly described below.

Referring to FIGS. 35 and 36, a lower channel pattern CHa and an upper channel pattern CHb may be stacked on the active region 102 of the substrate 100. The lower and upper channel patterns CHa and CHb may be sequentially stacked in the first direction D1 that is perpendicular to the top surface 100U of the substrate 100.

In an embodiment, the lower channel pattern CHa may include a plurality of lower semiconductor patterns 110A, which are stacked in the first direction D1. The lower semiconductor patterns 110A may be spaced apart from each other in the first direction D1. The lowermost one of the lower semiconductor patterns 110A may be an upper portion of the active region 102. The lower semiconductor patterns 110A may be formed of or include at least one of silicon (Si), silicon germanium (SiGe), or germanium (Ge). The upper channel pattern CHb may be a single channel pattern that extends in the first direction D1. Each of the upper channel pattern CHb and the lower semiconductor patterns 110A may have a thickness in the first direction D1. A thickness Tb of the upper channel pattern CHb may be larger than a thickness Ta of each of the lower semiconductor patterns 110A. The upper channel pattern CHb may be spaced apart from the uppermost one of the lower semiconductor patterns 110A in the first direction D1. The upper channel pattern CHb may be formed of or include at least one of silicon (Si), silicon germanium (SiGe), or germanium (Ge).

The lower source/drain patterns SDa may be disposed on the active region 102 of the substrate 100. The lower source/drain patterns SDa may be disposed at both sides of the lower channel pattern CHa and may be connected to the lower channel pattern CHa. The lower source/drain patterns SDa may be spaced apart from each other in the third direction D3 with the lower channel pattern CHa interposed therebetween. In an embodiment, the lower semiconductor patterns 110A of the lower channel pattern CHa may be interposed between the lower source/drain patterns SDa. Each of the lower semiconductor patterns 110A may be connected to the lower source/drain patterns SDa and may be in direct contact with the lower source/drain patterns SDa. Each of the lower source/drain patterns SDa may be in contact with side surfaces of the lower semiconductor patterns 110A. The lower source/drain patterns SDa may be epitaxial patterns, which are formed using the substrate 100 and the lower semiconductor patterns 110A as a seed layer. The lower source/drain patterns SDa may be configured to exert a tensile strain or a compressive strain on the lower channel pattern CHa.

The upper source/drain patterns SDb may be disposed on the active region 102 of the substrate 100 and may be stacked on the lower source/drain patterns SDa. The upper source/drain patterns SDb may be stacked on the lower source/drain patterns SDa in the first direction D1 and may be spaced apart from the lower source/drain patterns SDa in the first direction D1. The upper source/drain patterns SDb may be disposed at both sides of the upper channel pattern CHb and may be connected to the upper channel pattern CHb. The upper source/drain patterns SDb may be spaced apart from each other in the third direction D3 with the upper channel pattern CHb interposed therebetween. The upper source/drain patterns SDb may be epitaxial patterns which are formed using the second barrier pattern 124 and the upper channel pattern CHb as a seed layer. The upper source/drain patterns SDb may be configured to exert a tensile strain or a compressive strain on the upper channel pattern CHb.

The gate structure GS may be disposed on the upper channel pattern CHb to cover the upper and lower channel patterns CHb and CHa. The gate electrode GE of the gate structure GS may be extended in the second direction D2 to cover side surfaces of the upper channel pattern CHb, which are opposite to each other in the second direction D2, and side surfaces of the lower channel pattern CHa, which are opposite to each other in the second direction D2. The gate electrode GE may be extended into a region between the upper and lower channel patterns CHb and CHa and into a region between the lower semiconductor patterns 110A of the lower channel pattern CHa. The gate insulating pattern GI of the gate structure GS may be interposed between the upper channel pattern CHb and the gate electrode GE and may enclose an outer surface of the upper channel pattern CHb. The gate insulating pattern GI may be interposed between each of the lower semiconductor patterns 110A of the lower channel pattern CHa and the gate electrode GE to cover an outer surface of each of the lower semiconductor patterns 110A.

The insulating spacer 130 may be interposed between a portion of the gate electrode GE, which is located between the upper and lower channel patterns CHb and CHa, and the first barrier pattern 122 and may be extended into a region between the portion of the gate electrode GE and the second barrier pattern 124. The insulating spacer 130 may be interposed between the first barrier pattern 122 and at least one of the lower channel pattern CHa and the gate electrode GE and may be extended into a region between the second barrier pattern 124 and at least one of the upper channel pattern CHb and the gate electrode GE.

The gate electrode GE, the lower channel pattern CHa, and the lower source/drain patterns SDa may constitute a lower transistor, and the gate electrode GE, the upper channel pattern CHb, and the upper source/drain patterns SDb may constitute an upper transistor. In an embodiment, the lower transistor may be a gate-all-around field effect transistor or a multi-bridge channel field effect transistor (MBCFET). The upper transistor may be a fin field effect transistor (FinFET). The lower and upper transistors may be vertically stacked on the substrate 100 and in the first direction D1 and may be called 'stacked transistors'. Except for the afore-described differences, the semiconductor device according to the present embodiments may be substantially the same as the semiconductor device described with reference to FIGS. 1 to 4.

A semiconductor device according to an embodiment of the inventive concepts may include a negative capacitance (NC) FET using a negative capacitor. As an example, the gate insulating pattern GI may include a ferroelectric layer having a ferroelectric material property and a paraelectric layer having a paraelectric material property. The ferroelectric layer may have a negative capacitance, and the paraelectric layer may have a positive capacitance. In the case where two or more capacitors are connected in series and each capacitor has a positive capacitance, a total capacitance may be less than a capacitance of each of the capacitors. By contrast, in the case where at least one of serially-connected capacitors has a negative capacitance, a total capacitance of the serially-connected capacitors may have a positive value and may be greater than an absolute value of each capacitance. In the case where a ferroelectric layer having a negative capacitance and a paraelectric layer having a positive capacitance are connected in series, a total capacitance of the serially-connected ferroelectric and paraelectric layers may be increased. Due to such an increase of the total capacitance, a transistor including the ferroelectric layer may have a subthreshold swing (SS) less than 60 mV/decade, at the room temperature.

The ferroelectric layer may have a ferroelectric material property. The ferroelectric layer may be formed of or include at least one of, for example, hafnium oxide, hafnium zirconium oxide, barium strontium titanium oxide, barium titanium oxide, and/or lead zirconium titanium oxide. Here, the hafnium zirconium oxide may be hafnium oxide that is doped with zirconium (Zr). Alternatively, the hafnium zirconium oxide may be a compound composed of hafnium (He, zirconium (Zr), and/or oxygen (O). The ferroelectric layer may further include dopants. For example, the dopants may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and/or tin (Sn). The kind of the dopants in the ferroelectric layer may vary depending on a ferroelectric material included in the ferroelectric layer. In the case where the ferroelectric layer includes hafnium oxide, the dopants in the ferroelectric layer may include at least one of, for example, gadolinium (Gd), silicon (Si), zirconium (Zr), aluminum (Al), and/or yttrium (Y). In the case where the dopants are aluminum (Al), a content of aluminum in the ferroelectric layer may range from 3 to 8 at % (atomic percentage). Here, the content of the dopants (i.e., aluminum) as the dopants may be a ratio of the number of aluminum atoms to the number of hafnium and aluminum atoms. In the case where the dopants are silicon (Si), a content of silicon in the ferroelectric layer may range from 2 at % to 10 at %. In the case where the dopants are yttrium (Y), a content of yttrium in the ferroelectric layer may range from 2 at % to 10 at %. In the case where the dopants are gadolinium (Gd), a content of gadolinium in the ferroelectric layer may range from 1 at % to 7 at %. In the case where the dopants are zirconium (Zr), a content of zirconium in the ferroelectric layer may range from 50 at % to 80 at %.

The paraelectric layer may have a paraelectric material property. The paraelectric layer may be formed of or include at least one of, for example, silicon oxide and/or high-k metal oxides. The metal oxides, which can be used as the paraelectric layer, may include at least one of, for example, hafnium oxide, zirconium oxide, and/or aluminum oxide, but the inventive concepts is not limited to these examples.

The ferroelectric layer and the paraelectric layer may be formed of or include the same material. The ferroelectric layer may have the ferroelectric material property, but the paraelectric layer may not have the ferroelectric material property. For example, in the case where the ferroelectric and paraelectric layers contain hafnium oxide, a crystal structure of the hafnium oxide in the ferroelectric layer may be different from a crystal structure of the hafnium oxide in the paraelectric layer.

The ferroelectric layer may exhibit the ferroelectric material property, only when it is in a specific range of thickness. In an embodiment, the ferroelectric layer may have a thickness ranging from 0.5 to 10 nm, but the inventive concepts is not limited to this example. Since a critical thickness associated with the occurrence of the ferroelectric material property varies depending on the kind of the ferroelectric material, the thickness of the ferroelectric layer may be changed depending on the kind of the ferroelectric material. In an embodiment, the gate insulating pattern GI may include a single ferroelectric layer. Alternatively, the gate insulating pattern GI may include a plurality of ferroelectric layers spaced apart from each other. The gate insulating pattern GI may have a stacking structure, in which a plurality of ferroelectric layers and a plurality of paraelectric layers are alternately stacked.

According to an embodiment of the inventive concepts, a first barrier pattern and a second barrier pattern, which include different materials, may be disposed between lower source/drain patterns and upper source/drain patterns stacked on a substrate. A lower transistor including the lower source/drain patterns may be electrically disconnected from an upper transistor including the upper source/drain patterns by the first and second barrier patterns. In addition, the second barrier pattern may be used as a seed layer in an epitaxial growth process for forming the upper source/drain patterns. Accordingly, the upper source/drain patterns may be easily grown, and in this case, it may be possible to prevent the upper transistor, which includes the upper source/drain patterns, from being deteriorated. Accordingly, a semiconductor device including the stacked transistors, which have improved performance and can be easily fabricated, and a method of fabricating the same may be provided.

While example embodiments of the inventive concepts have been particularly shown and described, it will be understood by one of ordinary skill in the art that variations in form and detail may be made therein without departing from the spirit and scope of the attached claims.

What is claimed is:

1. A method for forming a semiconductor device, comprising:
   forming a preliminary active pattern on a substrate, the preliminary active pattern including sacrificial layers and semiconductor layers alternately and repeatedly stacked in a first direction perpendicular to a top surface of the substrate;
   forming a sacrificial gate structure on the preliminary active pattern;
   forming gate spacers on side surfaces of the sacrificial gate structure;
   etching an upper portion of the preliminary active pattern using the sacrificial gate structure and the gate spacers as an etch mask to form upper sacrificial patterns and upper semiconductor patterns;
   forming preliminary insulating spacers on the side surfaces of the sacrificial gate structure, the gate spacers interposed between the side surfaces of the sacrificial gate structure and the preliminary insulating spacers, the preliminary insulating spacers extending on side surfaces of the upper sacrificial patterns and on side surfaces of the upper semiconductor patterns;
   etching a remaining portion of the preliminary active pattern using the sacrificial gate structure and the preliminary insulating spacers as an etch mask to form lower sacrificial patterns and lower semiconductor patterns;
   forming lower source/drain patterns on side surfaces of the lower sacrificial patterns and on side surfaces of the lower semiconductor patterns;
   forming a first barrier pattern and a second barrier pattern stacked in the first direction on the lower source/drain patterns;
   forming insulating spacers by removing upper portions of the preliminary insulating spacers, the insulating spacers interposed between the first barrier pattern and at least one of the upper sacrificial patterns and the upper semiconductor patterns and extended between the second barrier pattern and at least one of the upper sacrificial patterns and the upper semiconductor patterns; and
   forming upper source/drain patterns on the first and second barrier patterns,
   wherein the upper source/drain patterns are on side surfaces of the upper sacrificial patterns and on side surfaces of the upper semiconductor patterns.

2. The method of claim 1, wherein the first barrier pattern is between the lower source/drain patterns and the upper source/drain patterns, and the second barrier pattern is between the first barrier pattern and the upper source/drain patterns.

3. The method of claim 2, wherein the first barrier pattern includes a first material and the second barrier pattern includes a second material different from the first material.

4. The method of claim 3, wherein the first material included in the first barrier pattern is a first semiconductor material having a first conductivity type, and the second material included in the second barrier pattern is a second semiconductor material having a second conductivity type different from the first conductivity type.

5. The method of claim 4, wherein the lower source/drain patterns have the second conductivity type, and the upper source/drain patterns have the first conductivity type.

6. The method of claim 5, wherein the first barrier pattern and the upper source/drain patterns contain a first impurity of the first conductivity type, and
   a first concentration of the first impurity in the upper source/drain patterns is higher than a second concentration of the first impurity in the first barrier pattern.

7. The method of claim 6, wherein the second barrier pattern and the lower source/drain patterns contain a second impurity of the second conductivity type, and
   a third concentration of the second impurity in the lower source/drain patterns is higher than a fourth concentration of the second impurity in the second barrier pattern.

8. The method of claim 3, wherein the first material included in the first barrier pattern is a first insulating material, and the second material included in the second barrier pattern is a second insulating material doped with a semiconductor element.

9. The method of claim 1, further comprising:
   removing the sacrificial gate structure to form a gap region between the gate spacers;
   removing the lower and upper sacrificial patterns to form empty regions between the lower and upper semiconductor patterns; and
   forming a gate structure in the gap region and the empty regions.

10. The method of claim 9, further comprising:
    forming an upper electrode connected to one of the upper source/drain patterns; and
    forming a lower electrode connected to one of the lower source/drain patterns.

11. A method for forming a semiconductor device, comprising:
    forming a preliminary active pattern on a substrate, the preliminary active pattern including sacrificial layers and semiconductor layers alternately and repeatedly stacked in a first direction perpendicular to a top surface of the substrate;
    etching an upper portion of the preliminary active pattern to form upper sacrificial patterns and upper semiconductor patterns alternately and repeatedly stacked in the first direction;
    forming preliminary insulating spacers covering side surfaces of the upper sacrificial patterns and the upper semiconductor patterns;
    etching a remaining portion of the preliminary active pattern using the preliminary insulating spacers as an etch mask to form lower sacrificial patterns and lower semiconductor patterns alternately and repeatedly stacked in the first direction;

forming lower source/drain patterns covering side surfaces of the lower sacrificial patterns and the lower semiconductor patterns;

forming a first barrier pattern and a second barrier pattern stacked in the first direction on the lower source/drain patterns;

forming insulating spacers by removing upper portions of the preliminary insulating spacers, the insulating spacers exposing side surfaces of the upper sacrificial patterns and the upper semiconductor patterns, the insulating spacers interposed between the first barrier pattern and at least one of the upper sacrificial patterns and the upper semiconductor patterns and extended between the second barrier pattern and at least one of the upper sacrificial patterns and the upper semiconductor patterns; and forming upper source/drain patterns covering the exposed side surfaces of the upper sacrificial patterns and the upper semiconductor patterns.

12. The method of claim 11, wherein the first barrier pattern is between the lower source/drain patterns and the upper source/drain patterns, and the second barrier pattern is between the first barrier pattern and the upper source/drain patterns, and wherein the first barrier pattern includes a first material and the second barrier pattern includes a second material different from the first material.

13. The method of claim 11, wherein forming the first barrier pattern and the second barrier pattern comprises:

forming a semiconductor layer on the lower source/drain patterns;

forming the first barrier pattern by performing a first ion implanting process of injecting a first impurity of a first conductivity type into a lower portion of the semiconductor layer; and forming the second barrier pattern by performing a second ion implanting process of injecting a second impurity of a second conductivity type into an upper portion of the semiconductor layer, wherein the second conductivity type is different from the first conductivity type.

14. The method of claim 13, wherein the lower source/drain patterns have the second conductivity type, and the upper source/drain patterns have the first conductivity type.

15. The method of claim 14, wherein the first barrier pattern and the upper source/drain patterns contain the first impurity of the first conductivity type, and a first concentration of the first impurity in the upper source/drain patterns is higher than a second concentration of the first impurity in the first barrier pattern.

16. The method of claim 15, wherein the second barrier pattern and the lower source/drain patterns contain the second impurity of the second conductivity type, and a third concentration of the second impurity in the lower source/drain patterns is higher than a fourth concentration of the second impurity in the second barrier pattern.

17. The method of claim 11, wherein forming the first barrier pattern and the second barrier pattern comprises:

forming an insulating layer on the lower source/drain patterns; and forming the second barrier pattern by performing an ion implanting process of injecting a semiconductor element into an upper portion of the insulating layer, wherein the first barrier pattern is a lower portion of the insulating layer.

18. A method for forming a semiconductor device, comprising:

forming a preliminary active pattern on a substrate;

etching an upper portion of the preliminary active pattern to form an upper channel pattern;

forming preliminary insulating spacers covering side surfaces of the upper channel pattern;

etching a remaining portion of the preliminary active pattern using the preliminary insulating spacers as an etch mask to form a lower channel pattern;

forming lower source/drain patterns covering side surfaces of the lower channel pattern;

forming a first barrier pattern and a second barrier pattern vertically stacked on the lower source/drain patterns;

forming insulating spacers by removing upper portions of the preliminary insulating spacers, the insulating spacers exposing side surfaces of the upper channel pattern, the insulating spacers interposed between the first barrier pattern and at least one of the lower and upper channel patters and between the second barrier pattern and at least one of the lower and upper channel patterns; and forming upper source/drain patterns covering the exposed side surfaces of the upper channel pattern.

19. The method of claim 18, wherein the first barrier pattern is between the lower source/drain patterns and the upper source/drain patterns, and the second barrier pattern is between the first barrier pattern and the upper source/drain patterns, and wherein the first barrier pattern includes a first material and the second barrier pattern includes a second material different from the first material.

20. The method of claim 19, wherein the first material included in the first barrier pattern is a first semiconductor material having a first conductivity type, and the second material included in the second barrier pattern is a second semiconductor material having a second conductivity type different from the first conductivity type, wherein the lower source/drain patterns have the second conductivity type, and the upper source/drain patterns have the first conductivity type.

* * * * *